United States Patent [19]  [11]  4,250,543
Smith et al.  [45]  Feb. 10, 1981

[54] METHOD OF CONTROLLING PRODUCTION PROCESSES AND APPARATUS THEREFOR

[75] Inventors: Richard L. Smith, Livonia; Kent Van Allen, Beverly Hills, both of Mich.

[73] Assignee: Scans Associates, Inc., Livonia, Mich.

[21] Appl. No.: 926,913

[22] Filed: Jul. 21, 1978

[51] Int. Cl.³ .................. G05B 11/42; G05B 13/02
[52] U.S. Cl. ................................... 364/105; 73/118; 318/561; 318/610; 364/116; 364/118; 364/431
[58] Field of Search ............... 364/116, 118, 105, 431, 364/442; 318/609, 610, 611, 621, 624, 561; 73/118, 116, 117.2, 117.3; 324/15, 16, 19, 378

[56] References Cited
U.S. PATENT DOCUMENTS

| | | | |
|---|---|---|---|
| 3,441,836 | 4/1969 | Riley | 318/610 X |
| 3,628,129 | 12/1971 | Riley | 318/610 X |
| 3,656,043 | 4/1972 | Kawada et al. | 318/610 X |
| 3,919,961 | 11/1975 | McDougal | 318/610 X |
| 3,925,640 | 12/1975 | Duggan | 364/118 |

Primary Examiner—Joseph F. Ruggiero
Attorney, Agent, or Firm—Dolgorukov & Dolgorukov

[57] ABSTRACT

The specification discloses a novel method for controlling production processes of a pneumatic, electrical or hydraulic nature and apparatus therefor. The method, and therefore the apparatus for performing said method, counteracts any process change by utilizing the error difference and the rate of change of the error difference between a feedback signal related to a current condition of the process and a desired value related to the desired condition of the process.

The error difference and rate of change and then utilized to produce a correction signal which is adapted to remain unchanged as long as the process being controlled, and the desired value signal, both remain in static condition, but which also has a unique look ahead feature such that said correction signal attempts to become saturated as soon as a new desired value is supplied, or a process change occurs. The correction signal, if saturated, is brought out of saturation much faster by using both the rate of change of the actual error difference between said desired value and said feedback signals and the actual error difference between said signals in a manner which is much faster than if only the error difference was used. If said correction signal never does reach a saturation point, or if it is saturated, upon becoming unsaturated, the correction signal is then changed much faster than previously possible by using the rate of change of the error difference, rather than the error difference only.

67 Claims, 26 Drawing Figures

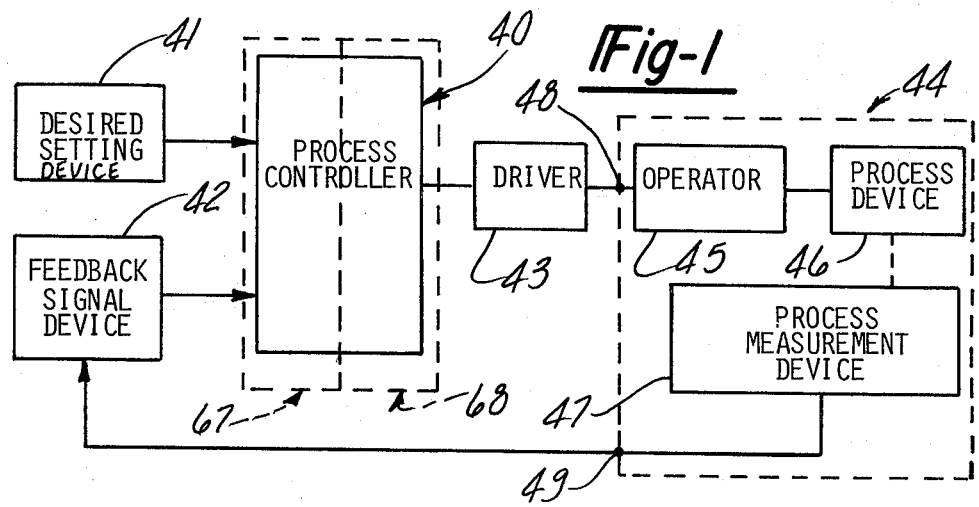
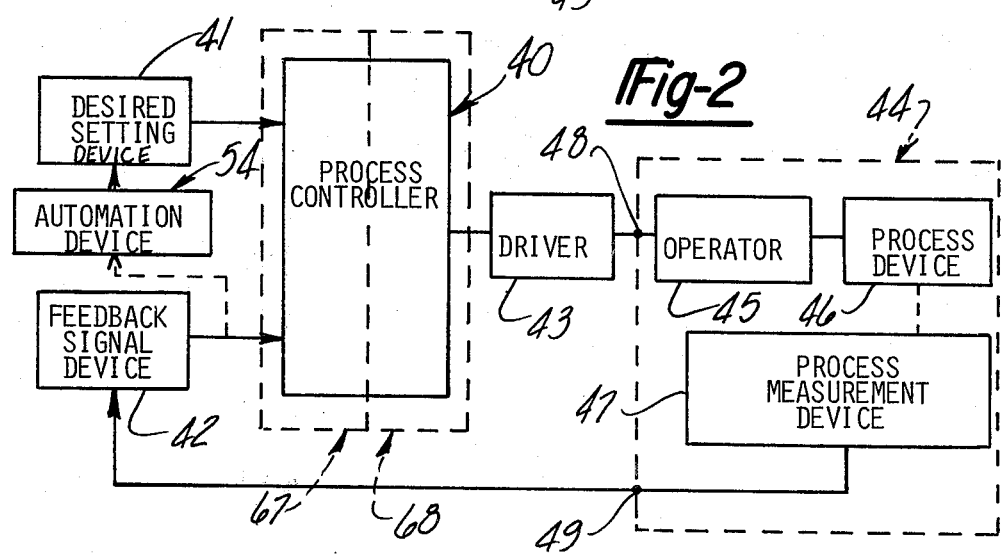
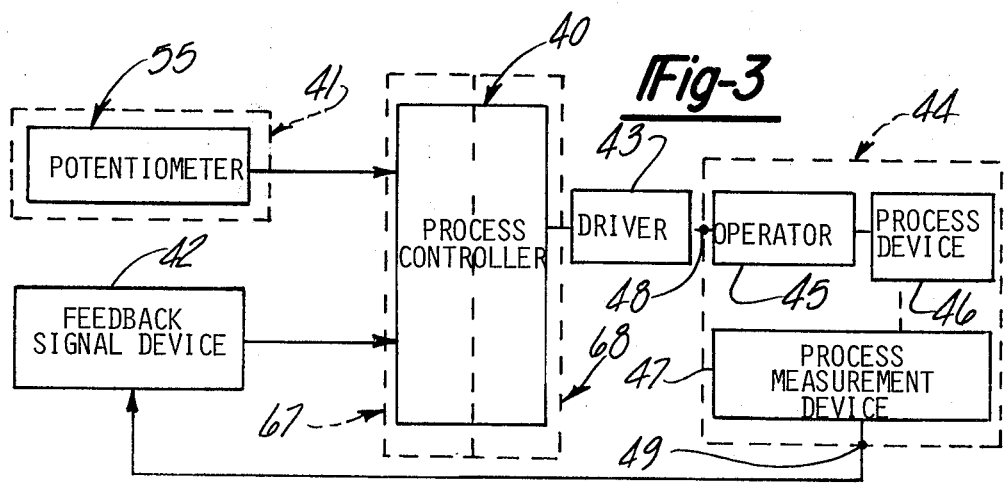

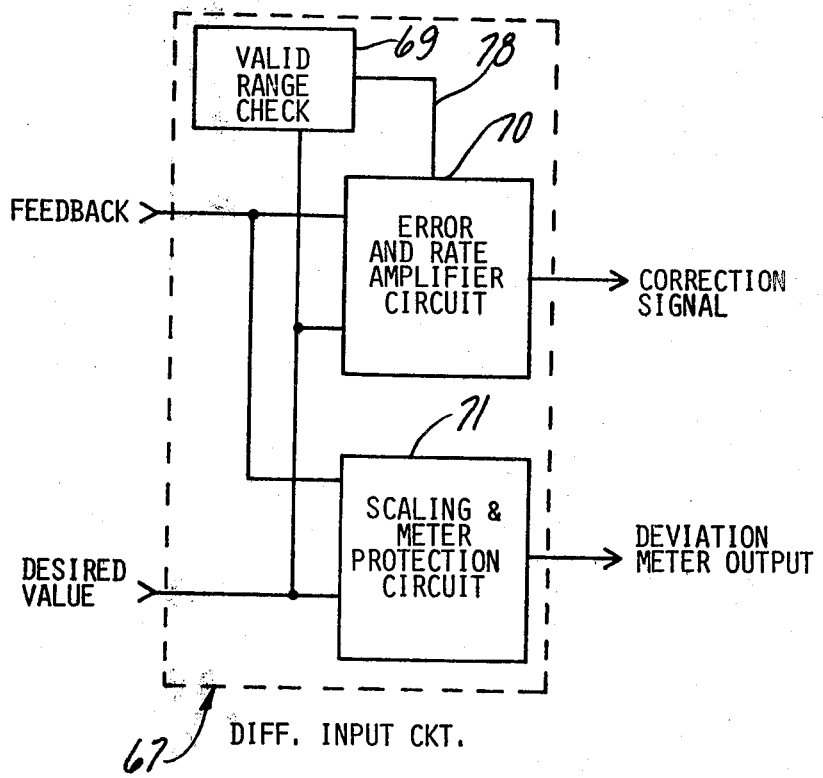

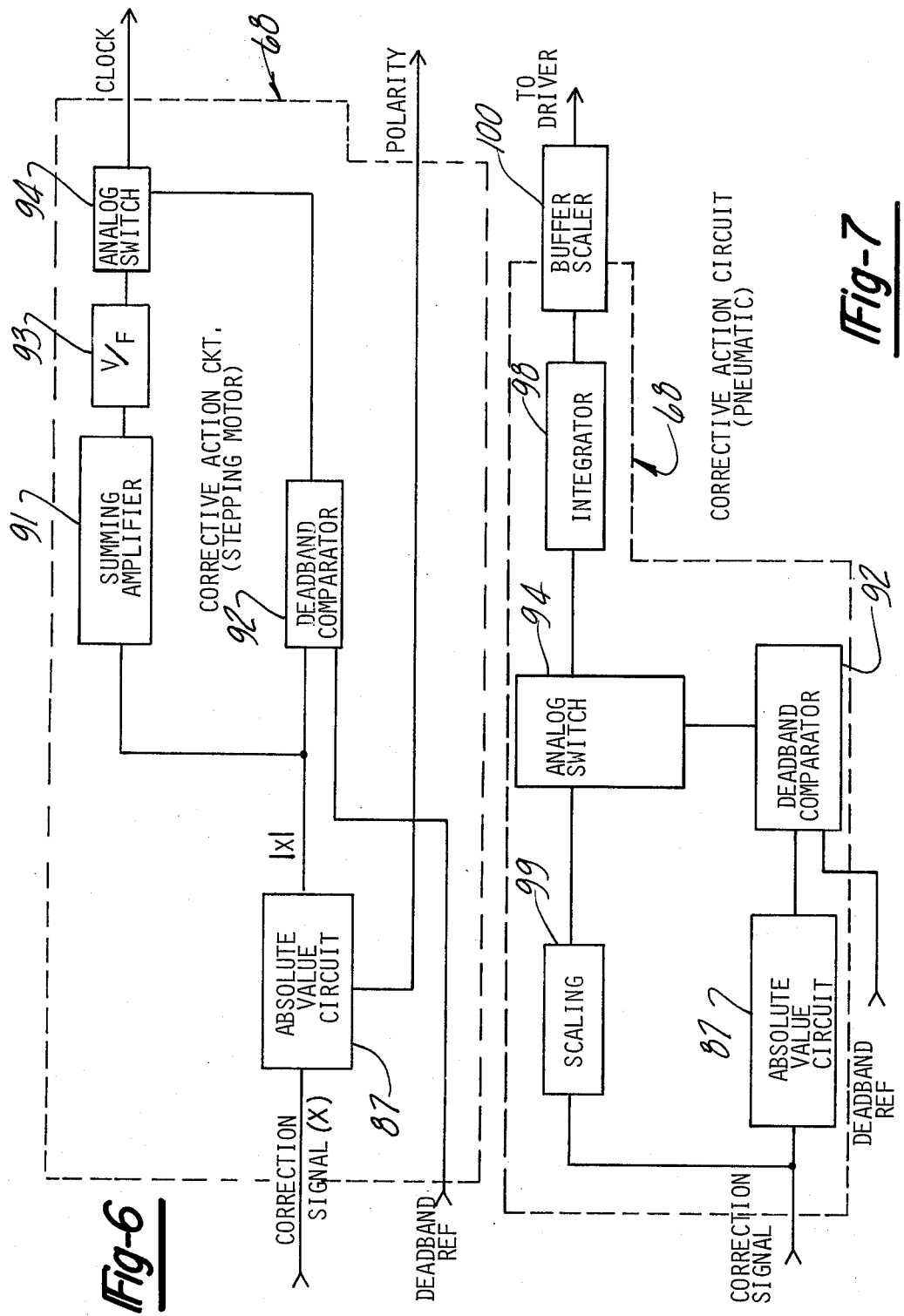

METHOD OF CONTROLLING PRODUCTION PROCESSES AND APPARATUS THEREFOR

The present application relates to process controllers and more particularly to an improved process controller wherein the controlling of production type processes is more accurate and faster than with those controllers presently available.

We have long been involved in the process controller art by virtue of the need to quickly and accurately control processes involved in stands for the testing of carburetors, such as those disclosed in U.S. Pat. Nos. 3,517,552; 3,524,344; 3,851,523; 3,896,670; 3,975,953 and 4,030,351. Processes which must be controlled in the carburetor testing stands disclosed in the above patents are hood pressure, manifold vacuum, and fuel pressure, among others. When controlling manifold vacuum, the control of the throttle plate of the carburetor to bring it to a desired position to produce a desired manifold vacuum is most critical. In the early days of carburetor testing when perhaps one or two test points were involved, and accuracy requirements were low, test time was not a particularly important factor. However, with the present day emphasis on fuel economy and exhaust emissions, and the need to test automobile carburetors at many points within their operational range, the ability to move the carburetor throttle plate, and thus produce a desired manifold vacuum at many test points quickly and accurately, is becoming increasingly important.

During the time when accuracy requirements permitted a simple set of relay contacts operating a motor to cause the throttle plate to move from one position, such as off-idle, to another position, such as part throttle, complex controls were not needed. However, as tests became more complicated and accuracy requirements became tighter, a search was made to determine a better way to cause the movement of the throttle plate from one position to another.

The idea of using a motor which could be moved in gross amounts clockwise and counterclockwise, such as by relay contacts, was abandoned, and the use of a motor which could be moved at two different speeds and could be shut off once the process was at or close to its desired value, called dead band, was instituted. Thus, the motor would move at a fast rate of speed when the process was far away from the desired value, and move at a much slower rate of speed when the process was near the desired value. However, as much of an advance as this two-speed throttle drive or process controller actually was over the prior art, it too was soon too slow for the ever increasing demands of production processes. This was primarily because there were only two fixed speeds, and if the process underwent rapid change, there would be quite a time lag for the throttle controller to adjust the throttle plate to a new condition within the dead band limits, which were becoming smaller because of still tighter accuracy requirements.

Therefore, further experimentation led to the invention of a throttle drive for a carburetor test stand having a proportional speed feature, in which the speed of the driving motor was proportional to the amount of error in the process. This invention, of which one of the co-inventors in the present case was a co-inventor, led to the grant of the U.S. Pat. No. 3,975,953, and it was thought that at long last one of the major problems in the carburetor industry was solved.

Between the time of making that invention, and the present day, it was found that in laboratory carburetor test benches where actual values for production tests of carburetors are determined, it was desirable to improve the speed and accuracy of the tests where, in addition to throttle control, manifold vacuum and carburetor inlet pressure control (known as hood pressure) are also required. At that time, such control of manifold vacuum and hood pressure was done using conventional process controllers, while throttle control was normally performed manually by the test stand operator. It was found that with the use of a computer it was possible to effectively use process control utilizing optimum rate, reset and proportional values for all three parameters—throttle, manifold vacuum and hood pressure, and because of the dedication of the computer to one stand, not only would you get the laboratory type accuracy which was desired, but also the testing speed became faster. This invention led to the grant of U.S. Pat. No. 4,030,351 for Method and Apparatus for Production Testing of Carburetors by one of the co-inventors.

During the years that were passing by while these developments were taking place, the demand for even faster and more accurate production test stands were being made, and we were compelled to embark on further research to see if we could not get a time for a typical carburetor test below the current test time for a particular model carburetor of approximately 9 minutes, and at the same time get the accuracy given by our laboratory test stands previously mentioned.

The mere implementation of the method used in our laboratory test stands might suffice to solve this serious problem in the art. However, ever, upon studying the disclosure in the aforementioned U.S. Pat. No. 4,030,351 one will note that there is a dedicated computer devoted to just one test stand. In the production testing of carburetors, a computer is normally used to control as many as sixteen (16) or more test stand simultaneously.

When you close a test loop with a computer in this fashion, you restrict the computer's ability to perform any other tasks efficiently, thereby showing the entire process. It was for this reason that an extension of the laboratory test stand concept to the production line was impractical. Also, it would be prohibitively expensive to have a dedicated computer for each production test stand when the quantity of production type test stand is considered. Thus, while laboratory accuracy could be obtained, the obtaining of it at production rates provided major obstacles. Thus, we needed to find a novel way to have accuracy without a dedicated computer.

By looking at conventional three-mode controllers presently on the market, such as the Model No. 52H-5E made by The Foxboro Company of Foxboro, Mass. in an attempt to still use a conventional controller for accuracy, but to get away from the need for a computer, it was very quickly found that because of certain operational characteristics such controllers were not useable. A major consideration was that such controllers do not have a definite dead band. In other words, even though the process controller would operate the carburetor to get the throttle plate to the desired position, one could not automatically and economically stop the action of the process controller at that point, and thus one would have a continuous hunting situation around the desired set point, and one could not get a stable process.

Further, there was not a single process controller on the market that controlled process operating devices of all three types that were required, namely the DC stepping motor, the AC synchronous motor and the pneumatic or hydraulic type positioner. This obviously then could not be a feasible solution, since the utilization of the available controllers would not produce a process controller capable of handling all the situations which are encountered. Further, the standard controllers found to be available were capable of controlling processes only over a relatively narrow range and did not have proportional, rate, and reset functions which were suitable to the processes which had to be controlled in the production testing of carburetors.

Thus, one of the objects of the present invention is to provide a new and improved process controller capable of providing laboratory accuracy at production process rates.

Another object of the present invention is to provide a three-parameter process controller having rate, reset and proportional types of action without the use of a dedicated computer.

Another object of the present invention is to provide a controller of the above nature having a definite dead band capability.

Another object of the present invention is to provide a process controller which is capable of controlling DC stepping motor type operators, AC synchronous operators, and pneumatic or hydraulic positioners.

A further object of the present invention is to provide a process controller having a wide range capability.

A further object of the present invention is to provide an improved process controller having rate, reset and proportional types of action which will quickly and accurately reach a value within a dead band range of the desired value and turn itself off, thus eliminating any hunting condition.

A further object of the present invention is to provide a three-parameter process controller of the above nature which is capable of manual or automatic control.

A still further object of the present invention is to make an improved process controller which can easily set processes to a multitude of different conditions for use in setting different process conditions and can be directed to do so by an automation device.

A further object of the present invention is to provide a process controller of the above nature which is capable of controlling manifold vacuum across a carburetor during a carburetor test cycle.

Another object of the present invention is to provide a production type process controller capable of giving laboratory accuracy while controlling pressure inside a carburetor test hood.

Another object of the present invention is to provide a production type process controller capable of controlling the pressure of a liquid in a conduit in a quick and accurate manner.

Another object of the present invention is to provide a process controller of the above-described nature which is suitable for controlling air flow through a carburetor.

Another object of the present invention is to provide a production type process controller which is reliable and relatively inexpensive to manufacture.

Another object of the present invention is to provide a two-directional switched driver capable of controlling the operation of any two-directional device, such as an AC synchronous motor.

Further objects and advantages of this invention will be apparent from the following description and appended claims, reference being had to the accompanying drawings forming a part of this specification, wherein like reference characters designate corresponding parts in the several views.

FIG. 1 is a general diagrammatic view of a closed-loop process embodying a process controller utilizing the construction of our present invention.

FIG. 2 is a diagrammatic view similar in part to that shown in FIG. 1, but showing a closed-loop process which has to be repeatedly be set to many conditions and thus embodies an automation device in connection with our improved process controller.

FIG. 3 is a view of a closed-loop process embodying a process controller utilizing the construction of our present invention and adapted to be operated manually.

FIG. 5 is a schematic diagram of one embodiment of the differential input circuit embodied in the process controller utilizing the construction of our present invention.

FIG. 6 is a schematic diagram of one embodiment of a corrective action circuit used in the process controller embodying the construction of our present invention.

FIG. 7 is a schematic view of another embodiment of a corrective action circuit which may be used in our novel process controller.

Figure 4A:
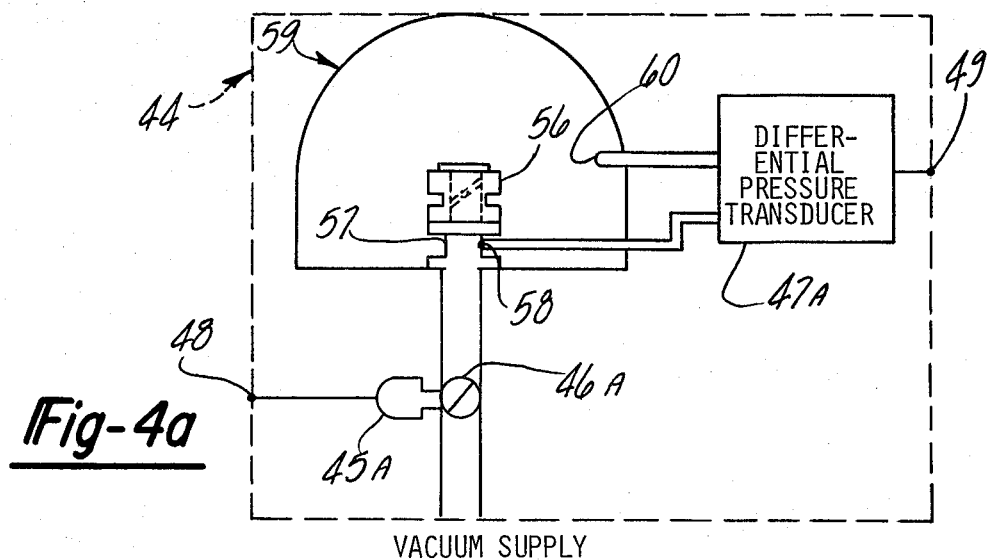
FIG. 4a is a diagrammatic view of a manifold vacuum control process which may be controlled utilizing a process controller embodying the construction of our present invention.

It is to be understood that the present invention is not limited in its application to the details of construction and arrangement of parts illustrated in the accompanying drawings. Since the invention is capable of other embodiments and of being practiced or carried out in various ways within the scope of the claims. Also, it is to be understood that the phraseology and terminology employed herein is for the purpose of description and not of limitation.

There is shown in FIG. 1 a typical use of our improved process controller, generally designated by the numeral 40. The process controller is supplied with a voltage reference indicating a desired value from a desired setting device 41 which causes the controller to supply a signal to the driver 43 which, in turn, supplies a process input signal to the process generally designated by the numeral 44 at the connection labeled 48. Since this is a closed-loop system we are concerned with, the process 44 will then supply a process correlate signal 49 indicating the current state of the process. If the correlate signal is a voltage signal useable by the process controller generally designated 40, it may be directly supplied thereto. If, however, the correlate signal is not directly compatible, a feedback signal devcie 42 is needed to convert the signal into one useable by the controller. For example, if the process correlate signal 49 is pneumatic in nature, the feedback signal device may take the form of a pressure transducer.

Since the means for converting these signals are well known in the art, and the types of conversions needed are so numerous, it is believed not practicable to describe all the various possibilities in the present application. It suffices to say that one skilled in the art would be able to provide a proper feedback signal device 42.

While FIG. 1 has shown a generalized diagrammatic view of a closed-loop system embodying our process controller 40, FIG. 2 shows an embodiment of our invention where it is desired to automatically operate at a variety of desired settings, such as to test over many test points of a device such as a carburetor or the like, where one may test over as many as 30 points. Some modification is needed for this situation over the generalized version because you would need a new desired value from the desired setting device 41 for each test point. While these could be set manually, as will be discussed below in relation to FIG. 3, it is much easier to have an automation device 54 which will automatically change the desired value for the next condition upon completion of the test at the present test point. It is also possible, as shown by the dotted line in FIG. 2, to tie the output from the feedback signal device 42 or the process correlate signal 49 to the automation device 54. This may be desired to confirm that the particular condition at which the process has arrived is indeed the desired condition before the automation device 54 takes further action.

As shown in FIG. 3, a manual system is possible using our invention where the particular design requirements for the system permit it, or where economy dictates such a system. In this case a potentiometer 55 could actually be the desired setting device 41.

It should be understood that there may be some conversion or signal conditioning necessary of the signal from the feedback signal device and of the actual signal from the desired setting device 41, which is set either manually or by the automation device 54 before the signals can be used by the process controller 40. Again the number of possibilities of conversion and signal conditioning means are numerous and so well known in the art, that it is not deemed necessary to describe them further herein.

As an example of processes which can utilize our improved process controller, there are shown in FIGS. 4a to 4f six different examples. Referring specifically to FIG. 4a, the process 44 in this example is one wherein the manifold vacuum across the carburetor 56 must be precisely contolled, and must be able to be set to different test conditions rapidly. In this instance the carburetor 56 is mounted on a riser 57 in any suitable manner inside the hood 59. In order to control the manifold vacuum across the carburetor, it is of course first necessary to know what the actual manifold vacuum is at any given moment. For this purpose, a differential pressure transducer 47a becomes the process measurement device, and is capable of giving a process correlate signal 49 as an output. Such a differential pressure transducer, which may be such as the 1151 DP series manufactured by Rosemount Engineering Co. of Minneapolis, Minn. has a high pressure input 60 connected to sense the pressure above the carburetor under the hood 59, and a low pressure input 58 connected in the throat of the carburetor riser 57 to sense the pressure beneath the carburetor. By methods well known in the art such differential pressure transducer then produces a process correlate signal 49 continuously related to the pressure drop across the carburetor at any given point, which is commonly known as the manifold vacuum.

Now referring back to any one of FIGS. 1, 2 or 3, such process correlate signal would be fed through a feedback signal device 42, if necessary, and then fed into the process controller 40. The process controller would compare the process correlate signal with a desired value and, if necessary, provide a corrective action signal to the driver 43, which the driver would then convert in a manner to be described hereinbelow, to a process input signal 48 capable of driving the operator 45. This then closes the loop and this operation will continually take place until the operator 45 causes the process device 46 to move to a position such that the process changes resulting in a change to the process measurement device 47 causing the process correlate signal to become stable and to correspond to the desired setting 41. At this point the process will have stabilized at the desired value. Once the process is stable and at the desired value, the process controller remains active, continuously repeating the comparison and correction process. Upon a process change for any reason or a new desired value, further correction is made until the process is again at the desired value. It can be seen that this operation holds true whether the system is the generalized version shown in FIG. 1, the automated version as shown in FIG. 2, or the manual version as shown in FIG. 3.

Figure 4B:
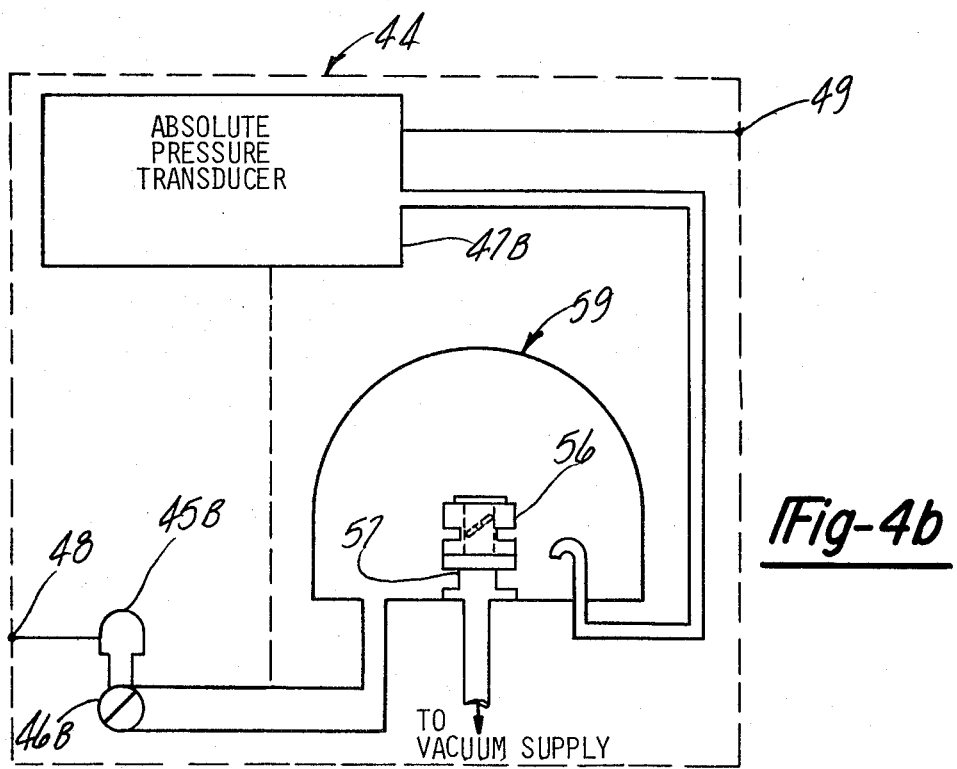
FIG. 4b is a diagrammatic view of a hood pressure control process which may be controlled utilizing a process controller embodying the construction of our present invention.

Another example of a process which can be controlled by our improved process controller is that shown in FIG. 4b where it is desired to accurately control the pressure inside the hood 59. In order to control such pressure one must measure the hood pressure, and this is done by an absolute pressure transducer 47b which may be such as the 1332 series manufactured by Rosemount Engineering Co. of Minneapolis, Minn. In a manner well known in the art, said absolute pressure transducer produces a process correlate signal 49 which, in a manner similar to that just described, is fed through a feedback signal device 42, if necessary, and then fed into the process controller 40.

As previously described, the process correlate signal 49 would be compared in a manner shown in FIGS. 1 to 3 with a signal from the desired setting device 41, and if a difference exists between the actual state of the process and the desired state of the process, the process controller would then supply the necessary signal to the driver 43 to drive the operator 45, which in this case is a valve operator 45b driving the process device which is in the form of a valve 46b. Again the new process correlate signal 49 would be supplied to the controller, compared to the signal from the desired signal device 41, and, if necessary, signals would be given to the driver 43 which would again produce a new process input signal 48, with the process continually repeating itself until the desired value is reached.

Figure 4C:
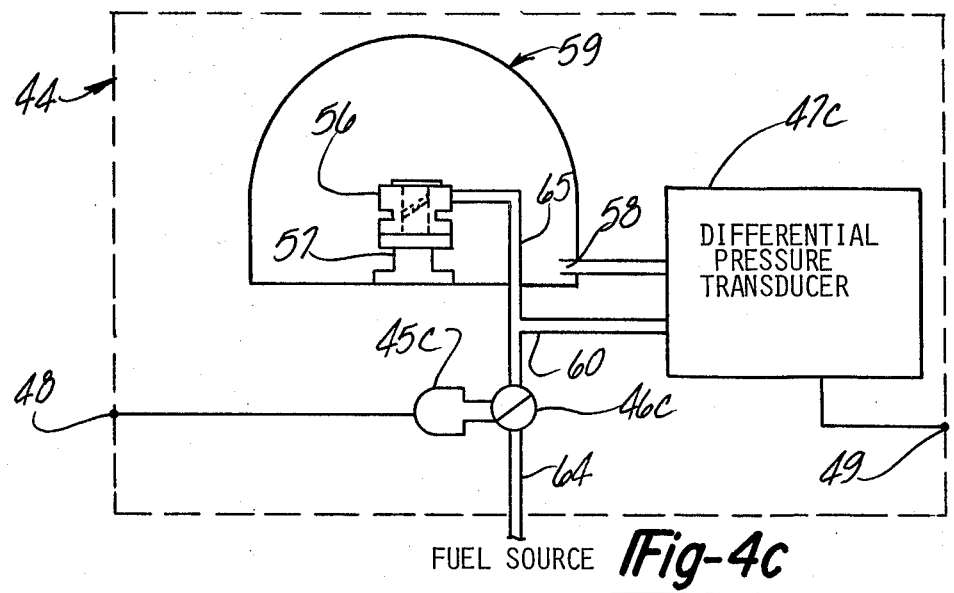
FIG. 4c is a diagrammatic view of a fuel pressure control process which may be controlled utilizing a process controller embodying the construction of our present invention.
Figure 4D:
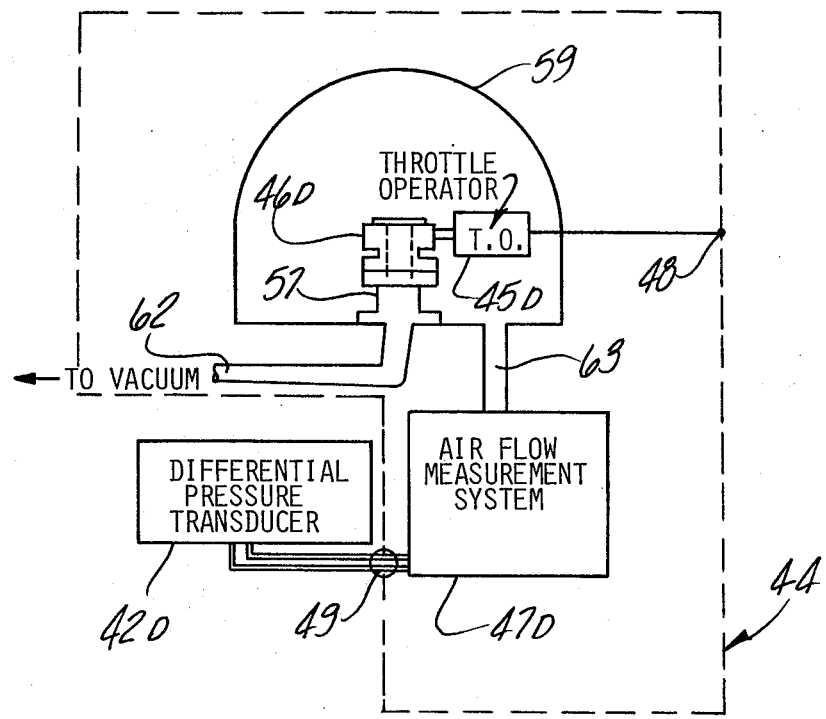
FIG. 4d shows an air flow measurement system which may embody the process controller which utilizes the construction of our present invention to control air flow.

Referring to FIG. 4c there is shown a process 44 adapted to control the pressure of the fuel being supplied to a carburetor or other like device. In this case, similar to that previously described, the carburetor 56 would be mounted on a riser 57 inside the hood 59, with fuel from the fuel source (not shown) passing through a first conduit 64 through a process device 46 in the form of a valve 46c through a second conduit 65 and into the carburetor 56. A process input signal 48 is supplied to the valve operator 45c which operates the valve 46c to perform the actual function of controlling the pressure within the second conduit 65. It should be understood that carburetors are also tested without use of hoods, and the pressure of the fuel supplied to the carburetor may be controlled by our improved process controller in such a system without a hood.

To obtain a measurement of the pressure in the conduit 65, a differential pressure transducer 47c is used as the process measurement device. Connections to the high pressure input 60 and the low pressure input 58 enable the differential pressure transducer 47c to determine the pressure in the system at any given time and supply the process correlate signal 49 to the process controller 40 through a feedback signal device 42, if needed. Again the comparison and correction process will take place in a manner previously described until the process is at the desired value within the dead band range of the process controller. The comparison process continues to occur while the process is within the dead band range until the process goes outside of the dead band whether due to a process change or a change in the desired value. At this time, the correction process again occurs until the process is again at the desired value.

In carburetor testing it is also necessary to measure the air flow to the carburetor, which in this case is controlled by the carburetor itself. Thus, the carburetor previously referred to under the numeral 56 becomes the process device and is now referred to by the numeral 46d. In order to measure the air flow through the carburetor, a hood 59 is provided which has an outlet 62 connected to a vacuum source, and an inlet 63 connected to an air flow measurement system 47d, which may be as subsonic nozzles or laminar flow tubes. The quantity of air flowing through the carburetor 46d then is controlled by the movements of the throttle plate, which is controlled by the throttle operator 45d. The throttle operator 45d is controlled by the process input signal 48.

To arrive at a desired air flow through the carburetor, it is necessary to know the air flow present in the system at any time. In this case, the air flow measurement system will provide a pressure correlate signal 49 in the form of a differential pressure signal which will be supplied to the feedback signal device 42, which now takes the form of a differential pressure transducer 42d. This, in turn, will supply the signal to the process controller relating to the current air flow conditions through the carburetor 46d. In a manner similar to that previously described, the comparison and correction operations will take place until the desired value within dead band limits is reached.

Figure 4F:
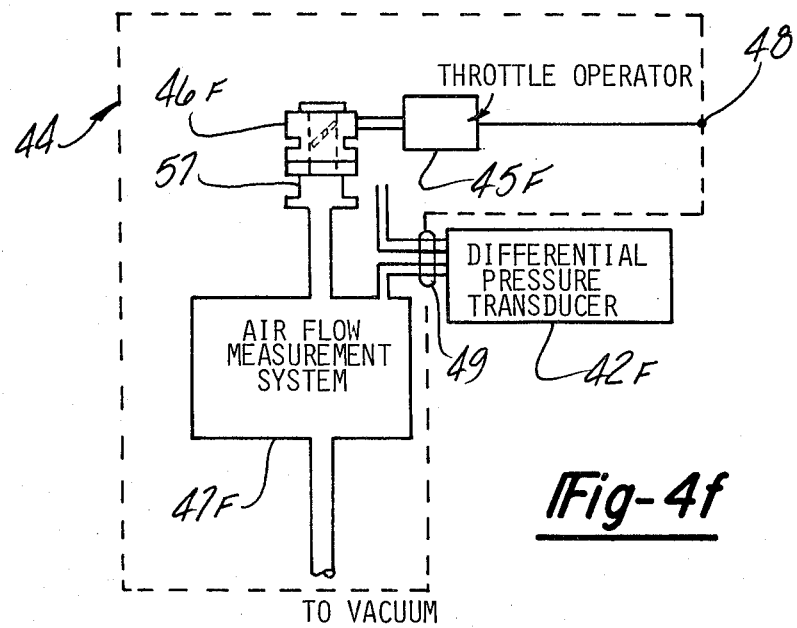
FIG. 4f is a view similar to that shown in FIG. 4e, but having the air flow measurement system operating in a controlled environment wherein a differential pressure transducer may be used to form the feedback signal device in place of the absolute pressure transducer.
Figure 4E:
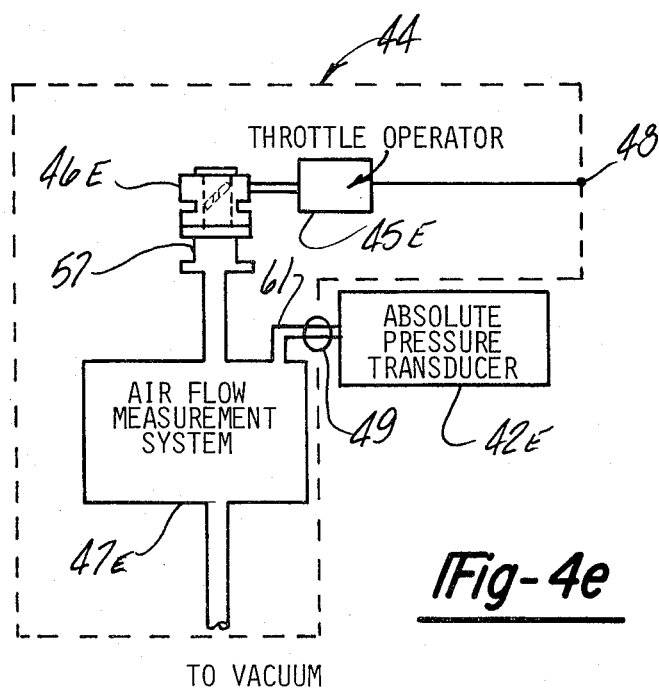
FIG. 4e shows an air flow measurement system similar to that shown in FIG. 4d, but using sonic flow devices, utilizing the process controller embodying the construction of our present invention.

When it is desired to have a sonic air flow measurement system using critical venturi meters or variable area critical venturi meters, the systems shown in FIGS. 4e and 4f may be the ones controlled by our process controller. Referring to FIG. 4e, it is actually the carburetor which is the process control device as in FIG. 4d, and it is, therefore, now labeled 46e rather than 56. The turning of the carburetor throttle plate by the throttle operator 45e controls the amount of air passing through the carburetor.

Since sonic air flow measurement is being used, wherein air flow is basically proportional to the absolute pressure, the carburetor hood 59 previously described is not required, but may be used. The carburetor 46e will be mounted on the riser 57 as previously described. The process input signal 48 drives the throttle operator while the pressure signal from the air flow measurement system 47e is the process correlate signal. Said process correlate signal 49 is supplied through the conduit 61 to the absolute pressure transducer 42e. The process correlate signal 49 is transformed into a signal compatible with the process controller by the feedback signal device 42 in the form of the absolute pressure transducer 42e. Again, the signal, in a manner similar to that previously described, is compared with a desired value signal from a desired value setting device and, if necessary, the process controller supplies a signal to the driver 43 which, in turn, supplies a process input signal 48 to the operator 45e. The comparison and correction process will continue until the process correlate signal corresponds to the desired setting, thus setting the air flow through the carburetor 46e to the desired value within dead band limits of the process controller.

Another system 44 for setting the air flow through the carburetor using the sonic flow devices is shown in FIG. 4f. In this case, the throttle operator 45f, the carburetor 46f, and the carburetor riser 57 may be the same as those indicated by numerals 45e, 46e, and 57, shown in FIG. 4e. However, to utilize a transducer with a smaller span, the differential pressure transducer 42f may be used instead of the absolute pressure transducer 42e to form the feedback signal device. In this case the measurement of air flow is taking place as a function of manifold vacuum because when the process 44 is being performed in a controlled atmospheric room, manifold vacuum relates to absolute pressure and, therefore, air flow is a function of the manifold vacuum. Thus, the process correlate signal is the differential pressure signal 49, and this would be supplied to the differential pressure transducer 42f. The signal from the feedback signal device, in this case a differential pressure transducer 42f, would be used in a manner described immediately above to produce any changes necessary in the process input signal 48 until the process input signal 48 corresponds to the process correlate signal 49 and the process is at the desired value within dead band limits of the process controller.

The description thus far has dealt substantially with illustrations of a general nature showing various closed-loop processes embodying our invention and the types of processes they can control, and has not dealt with any detailed description of the operation of the process controller itself, or of its novel features over those controllers known in the art.

To more fully understand the novelty and operation of our invention, it is to be noted that the process controller 40 shown in FIGS. 1, 2 and 3 consists of two portions, the differential input circuit 67 and the corrective action circuit 68. In general, the differential input circuit compares the process feedback signal with the desired value signal from the desired setting device, finds the actual error difference between the two signals (static), finds the rate of change (dynamic) between the two signals, sums them algebraically, and then provides an output signal to be used by the corrective action circuit 68 to control the driver 43, as necessary. If the desired value is within the set points 72 and 73, the error and rate amplification circuit 70 (FIG. 10) will operate normally, resulting in the appropriate correction signal being supplied to the corrective action circuit 68. However, if the desired value is outside the valid range set points, this will cause the error and rate amplification circuit to become saturated and go to a full plus or full minus saturated condition depending on whether the desired value was outside the high limit set point 72 or the low limit set point 73. This, in turn, will ultimately cause the process device 46 to rapidly go to one extreme or another, for example, fully opened or fully closed, and stay there until some further signals are received from the circuitry.

It should be understood that the process is generally one of a dynamic nature, and the process controller is attempting to obtain a stable static condition. If the correction signal from the error and rate amplifier circuit 70 is within dead band limits, the process controller 40 provides a static output signal and the control remains held until an upset or change in the process causes the process to go outside the dead band limits. The process will be considered to be within the dead band limits when said correction signal is essentially at zero value, which may be when the rate of change is equal in value to the error signal, but opposite in polarity, or when the rate of change is at a zero value.

Referring to FIG. 5, the feedback and the desired value signals are fed to both the error and rate amplifier circuit 70 and to the scaling and meter protection circuit 71. Additionally, the desired value signal is fed to the valid range check circuit 79. The purpose of the error and rate amplifier circuit is to algebraically sum the actual difference between the feedback and the desired value signal, which is a static error, and the rate of change of the feedback signal with respect to the desired value signal, which is a dynamic error. Additionally, in order to protect the process equipment, a valid range check circuit 69 is provided. This is necessary because in some embodiments of our invention, the stepping motors used can easily damage the equipment being tested due to the motor characteristics. As is well known in the art (see Design Engineer's Guide to DC Stepping Motors by Superior Electric Company, Bristol, Conn.) at very high speeds, stepping motors have very low torque. However, at the low speeds the torque is very high. Thus, in certain types of tests, for example a carburetor test where the stepping motor is turning the carburetor throttle plate, when the desired value is out of range, an undesirable condition could occur, namely that the carburetor throttle plate could become fully closed or fully opened with the stepping motor turning slowly with large torque. The carburetor could easily become damaged, or the mechanical connection between the stepping motor and the carburetor could become damaged.

Figure 9:
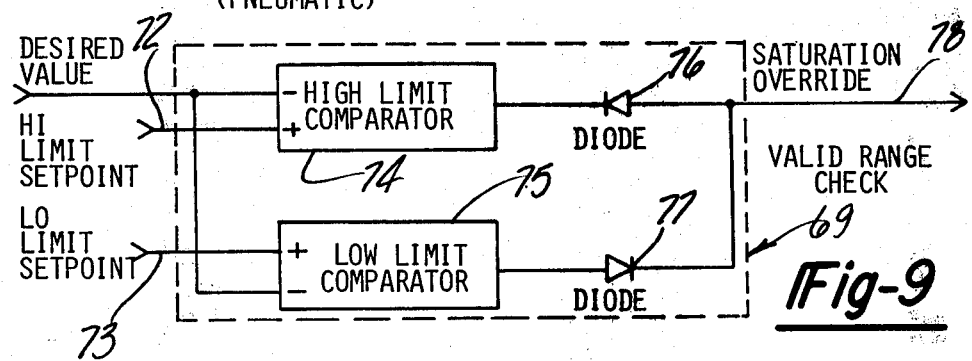
FIG. 9 is a schematic diagram of the valid range check circuit embodied in the construction of our present invention.

To prevent this, the valid range check circuit 69 compares the desired value against the high limit set point 72 and the low limit set point 73, as shown in FIG. 9. If the desired value is within the valid range set points, the valid range check circuit 69 will cause the error and rate amplifier circuit 70 to operate in its normal mode supplying the correction signal to the corrective action circuit 68. However, if the desired value is outside the valid range set points, the valid range check circuit will act in a manner to cause the stepping motor to operate at its maximum speed and drive the process device to its fully closed or fully opened position. As previously mentioned, at full speed stepping motors have a very low torque, so in this case when the process device reaches its fully opened or fully closed position, the stepping motor will simply stall, causing the process device 46 to cease further adjustment. Upon becoming aware of this condition, the operating personnel can take the necessary action to correct this situation.

Typically, in a process control circuit there is provided a deviation meter to indicate the relationship between the current condition of the process and the desired set point. Since these process ranges are usually rather large, and the desired meter range is relatively small, it is necessary to provide a means of scaling the available error signal to a signal useable by the meter. It is also desirable to protect the meter from an overload condition should the process error exceed the range. This is done by the scaling and meter protection circuit.

Figure 10:
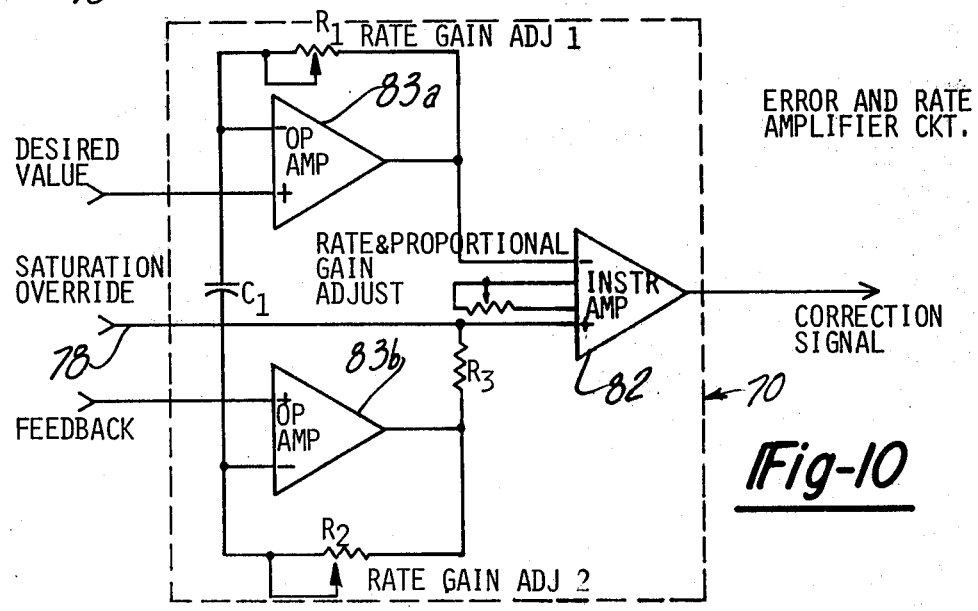
FIG. 10 is a schematic diagram of the error and rate amplifier circuit used in the construction of our present invention.
Figure 11:
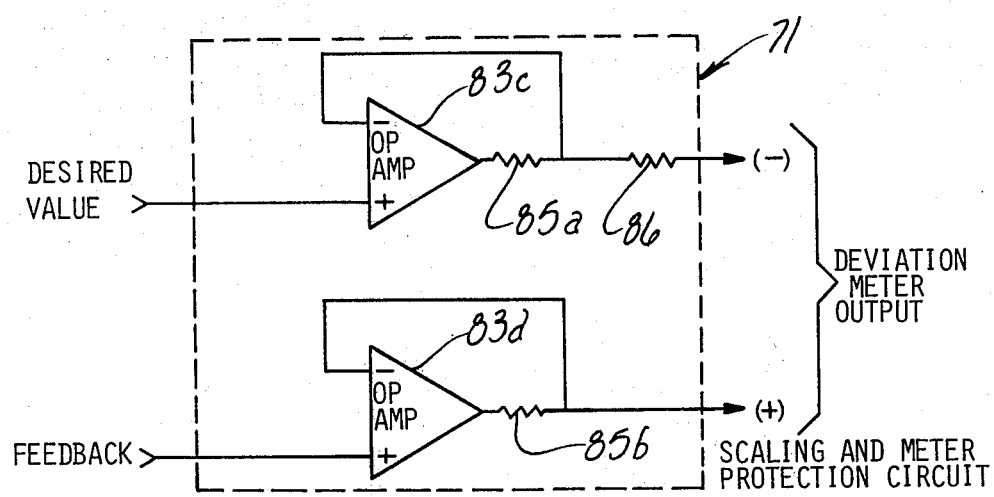
FIG. 11 is a schematic diagram of an embodiment of a scaling and meter protection circuit embodied in the construction of our present invention.

A detailed description of the operation and components of the valid range check circuit, error and rate amplifier circuit, and scaling and meter protection circuit can be found in FIGS. 9, 10 and 11, respectively.

In FIG. 9, the valid range check circuit 69 operates by connecting a high limit set point 72 to the high limit comparator 74 and the low limit set point 73 to the low limit comparator 75. At the same time the desired value signal is supplied to both comparators, which can be such as Model 8311 made by Analog Devices, Inc. of Bloomingdale, Ill. The output of the high limit comparator is connected to the cathode of the high limit diode 76, and the output of the low limit comparator is connected to the anode of the low limit diode 77. The anode of the high limit diode 76 and the cathode of the low limit diode 77 are connected together and form the saturation override signal 78. If the desired value signal supplied to the high limit comparator is less than the high limit set point, then the high limit comparator goes to its high state causing the high limit diode 76 to go to a nonconductive state allowing normal operation.

Similarly, if the desired value is greater than the low limit set point, the low limit comparator 75 goes to its low state and the low limit diode 77 goes to its nonconductive state allowing normal operation. If both circuits allow normal operation, the error and rate amplifier circuit operates normally.

However, if the desired value is above the high limit set point, the high limit comparator will go to its low state causing the high limit diode 76 to become conductive supplying a saturation override signal 78 to the error and rate amplifier circuit and ultimately to the corrective action circuit to be described.

Also, if the desired value is less than the low limit set point, the low limit comparator will go to its low state causing the low limit diode 77 to become conductive and supply a saturation override signal to the error and rate amplifier circuit shown in FIG. 10.

Referring now to FIG. 10, for the error and rate amplifier circuit, it can be seen that the saturation override signal 78 is supplied to the positive input of an instrumentation amplifier 82 which may be such as the Model No. AD521, also manufactured by Analog Devices, Inc. When the desired value is within the high and low limit set points 72 and 73, the high limit diode 76 and the low limit diode 77 are both in their nonconductive state, resulting in no saturation override signal 78 being supplied, thus effectively disconnecting the valid range check circuit 69 and allowing the error and rate amplification circuit 70 to operate in its normal fashion.

Again, referring to FIG. 10, the desired value signal, which is commonly a static signal, is connected to the positive input of a first operation amplifier 83, the output of which is connected to the negative input of the instrumentation amplifier 82 with a resistive feedback R1, connected in parallel with the operational amplifier and providing a signal to the negative input thereof. Under static conditions this provides what is commonly known in the art as a voltage follower circuit whereby the voltage output of the operational amplifier 83a is equal to the input thereof, which in this case is the desired value signal.

A second voltage follower circuit is similarly provided by connecting the feedback signal to the positive input of a second operational amplifier 83b, the output of which is connected to the resistance R3 with the feedback resistance R2 being connected between the output and the negative input thereof. The resistance R3, which is preferably of a rather low value, allows the saturation override signal 78 to override the normal operation of the error plus rate amplifier circuit under predetermined conditions, as described previously. With both the voltage follower circuits effectively connected to the instrumentation amplifier 82, and with the saturation override signal 78 effectively eliminated as described above, and with the system effectively in a static state condition, the correction signal is equal in magnitude to the difference between the feedback and the desired value signal, multiplied by the rate and proportional gain factor. We, in effect, now have the static state correction signal which is supplied to the corrective action circuit for the purposes previously described.

However, a dynamic state is encountered when the feedback signal is changing in relation to the desired value signal, which is the case when the process is changing.

In this case, we in effect have a series circuit from the output of the first operational amplifier 83a through its feedback resistor R1 through the capacitor C1 through the feedback resistor R3 to the second operational amplified 83b output. Depending upon the relationship between the desired value signal and the feedback signal, there will be current flow from the output of one of the operational amplifier circuits through the capacitor C1 and both feedback resistors R1 and R2 to the output of the other operational amplifier circuit causing the voltage change rate across the capacitor C1 to be the same as the rate of change between the desired value signal and the feedback signal.

The voltage developed across R1 as a result of the current flow will be added algebraically to the desired value signal voltage and fed to the negative input of the instrumentation amplifier 82. Similarly, the voltage developed across R2, which will be of opposite polarity, will be algebraically added to the feedback signal voltage and fed through resistor R3 to the positive input of said instrumentation amplifier.

The instrumentation amplifier 82 provides as an output a single correction signal which is a function of the difference of the desired value, the feedback signal, the gain factors, the value of the capacitor C1 and the rate of the change between the desired value signal and the feedback signal. This can be expressed in the formula that the correction signal is a function of:

$$G[(F - DV) + C_1 \times (R_1 + R_2) \times (d \frac{(F - DV)}{dt})]$$

where
$C_1$ = value of C1 in farads
G = rate + proportional gain factor
F = feedback signal voltage
DV = desired value signal voltage
d/dt = derivative with respect to time in seconds
R = resistance in ohms The value of the resistances R1 and R2 will depend upon the particular process and the desired proportional gain and rate gain. In this particular embodiment of the error and rate amplifier circuit, the rate plus proportional gain adjust will be set for the proportional gain desired for the particular process being controlled. Then the variable resistances R1 and R2 will be set, preferably equal to each other, at the value such that the overall rate gain will be equal to the product of the rate plus proportional gain factor times the rate gain factor.

In this particular mode, which is a differential mode, operating our novel controller with the use of relatively high gain factors, such as the one used by Applicants in one application of the present invention having a value of 5, the circuit can easily go to a saturated condition, thus making the above formula for the correction signal inoperable. Since it is desired to have such formula operable over as large a range as possible, by use of this novel arrangement of circuitry we are able to bring the circuit out of the saturated condition by use of the rate portion of the circuit, which is, in effect, a look ahead feature, much earlier than the proportional circuit itself could be brought out of the saturated condition, thus giving much greater controlability of the circuit than was possible heretofore.

To more fully understand the operation of the error and rate amplifier circuit, we should analyze the correction signal output function as defined in the formula above. It should also be understood that typical operational amplifiers, such as those shown as 83a and 83b in FIG. 10, and a typical instrumentation amplifier, such as that shown as 82, also in FIG. 10, reach their saturated state at approximately 2 volts less than the power supply voltage furnished them. In a typical case, the saturated state occurs at approximately ±13 volts DC. This is to mean, any input greater than 13 volts or less than −13 volts may not entirely be useable and no output will exceed 13 volts nor be less than −13 volts. The typical feedback signal voltage and desired value signal voltage are in the range of zero to 5 volts DC, although other voltages and other operational amplifiers and instrumentation amplifiers are available that would result in other useable voltage ranges.

Referring to the above formula, in a static condition, the value of d(F−DV/dt) equals zero since there is no change with respect to time in the feedback and desired value signals. As such, the correction signal becomes a function of $$G \times [(F-DV)]$$

when the gain factor, for example, has a value of 10, and when the difference between the feedback and desired value signals exceeds approximately 1.3 volts, instrumentation amplifier 82 becomes saturated and the effect of the correction signal is to cause the process device to move to an extreme condition at a rapid rate, preferably one that the process correlate signal can continuously respond to.

In the typical operation, the process controller utilizes the feedback and desired value signals which are initially equal in value, for example zero volts. Thus, the correction signal equals zero. The desired value signal is then suddenly changed to another value within the valid range, such as 3 volts DC, which causes the correction signal to attempt to become saturated. In this case, since this is momentarily a static condition, the correction signal attempts to become
10×(0−3)32 −30 Volts
However, being beyond the saturation limit, it in fact becomes −13 volts typically, resulting in attempting to move the process device, such as a carburetor throttle, full speed towards the wide open throttle position. As the process device moves, the process correlate signal starts to increase. We should now reanalyze the above formula by using a slightly different form, namely $$G[(F + G_2 \frac{d(F - DV)}{dt}) - (DV - G_2 \frac{d(F - DV)}{dt})]$$

where $G_2 = R_1 C_1$, and for example might equal 10. The factor $F = G_2 d(F-DV)/dt$ is the output of the second operational amplifier 83b, while the factor $DV - G_2 d(F-DV)/dt$ is the output of the first operational amplifier 83a, neither of which can exceed the saturation limit, typically 13 volts. Also, the value of the entire formula cannot exceed the saturation limit.

As the process correlate signal, and thus the feedback signal F starts to increase, the value of the left portion of the above formula which is the output of the second operational amplifier, increases in value from zero volts, and the value of the right portion, which is the output of the first operational amplifier, increases in value from 3 volts at a somewhat slower rate since the value DV is static. This results in an overall reduction in the magnitude of the output of the correction signal from −30 volts until the system becomes within saturation. It should be observed that the main factor in changing the correction signal is the factor $G_2 d(F-DV)/dt$ which equates to the rate of change between the feedback and desired value signals. This factor typically might be changing at a speed ten times that at which the feedback signal might change. As such, the correction signal is reduced at a rate much faster by also using the rate of change of the actual error between the feedback and desired value signals than if the error difference only was considered. This is termed the look ahead feature, wherein the effect of the rate of change between the feedback and desired value signals is a much larger factor in determining the correction signal than the error difference between the feedback and desired value signals. When the correction signal falls within the saturation voltage, the process starts changing at a slower rate, although the process correlate signal response from the process is somewhat slower than the process device because normal operation of the carburetor, for example, is somewhat sluggish in nature.

As the process continues to change at a continuously slower rate, the correction signal value changes to a value within the deadband, thereby stopping further process device change. As the process correlate signal, and thus the feedback signal, continues to change somewhat, the correction signal reverses polarity, and a process device change starts to occur in the opposite direction, although at a slow rate since the magnitude of the correction signal typically remains small. This demonstrates a process device overshoot with little or no process overshoot yielding a faster process acquisition time, thus faster process control.

In another typical operation in which an external means, such as throttle adjustment, in causing a process, such as controlling hood pressure, to change at a relatively steady rate, the process starts with the process being controlled. Thus, the feedback and desired value signals are in a static condition and are equal in value, and thus the correction signal equals zero. In this case, the desired value is held at a constant value, but the external means of throttle adjustment is used to change the process and ultimately the process correlate signal, and thus change the feedback signal by for example 0.25 volts per second if no corrective action were to be taken. Again, as this is momentarily a static condition, the correction signal becomes some non-zero value. This results in moving the process device, such as the hood pressure value, in such a manner as to attempt to keep the feedback signal at its desired value. As the changes of throttle adjustment and hood pressure value are ocurring, the correction signal takes on a value such that the process operator tends to move at a relatively constant speed in tracking the feedback signal change caused by the throttle adjustment. This correction signal tends to be independent of the d(F−DV)/dt function, since the process correlate signal is essentially maintaining a value somewhat different than its original value. As essentially constant value, there is no rate of change in the difference between the feedback and desired value signals. When further throttle adjustment is ceased, the tracking ends and the look ahead feature will tend to dampen the process overshoot as in the previous example.

In an additional type of operation in which the desired value signal is changed at some relatively steady rate, the operation of the error and rate amplifier circuit is somewhat similar to that of the previous example. The process device will be moving in such a manner so as to attempt to change the feedback signal at the same rate that the desired value signal is changing, again resulting in the d(F−DV)/dt function essentially becoming zero in value, while the F−DV function takes on some relatively constant value. When the desired value change stops, the tracking ends, and the look ahead feature will again tend to dampen the process overshoot yielding a faster process acquisition time, thus faster process control.

In the case where a saturation override signal 78 is not effectively eliminated, and has been supplied to the error and rate circuit 70, this signal, which itself is a saturated signal, causes the instrumentation amplifier 82 to be driven and held into positive or negative saturation. The polarity of the instrumentation amplifier 82 output correction signal will be the same as the polarity of the saturation override signal. This correction signal, as above, is fed into one of the corrective action circuits shown in FIGS. 6, 7 and 8.

Referring now to FIG. 11, the operation of the scaling and meter protection circuit 71 can be described. In this case, we have, in effect, two voltage follower circuits with current limiting resistors before the feedback loop. The first of these circuits is formed by the first scaling circuit operational amplifier 83c and the first current limiting resistor 85a, and the second of these circuits is formed by the second scaling circuit operational amplifier 83d and a second current limiting resistor 85b. A scaling resistor 86 is provided at the output of the first current limiting resistor 85a. Thus, when the desired value signal enters the first scaling circuit operational amplifier 83c, and the feedback signal enters the second scaling circuit operational amplifier 83d, the two operational amplifiers together provide a differential output which is in the form of voltage, which has limited current capacity such that the meter will not be overranged. Depending upon the particular meter and scaling resistor 86 used, the desired deviation meter output may be obtained.

Referring now to FIG. 6, which is the preferred embodiment of the corrective action circuit 68, if a DC stepping motor is to be used as the operator 45, the purpose of the corrective action circuit is basically threefold. First to determine the absolute value of the correction signal, second to indicate to the driver to be described hereinafter the original polarity of the correction signal, and third to supply a clock signal to the driver. It should be understood that the clock signal is a series of pulses wherein the frequency varies.

Figure 16:
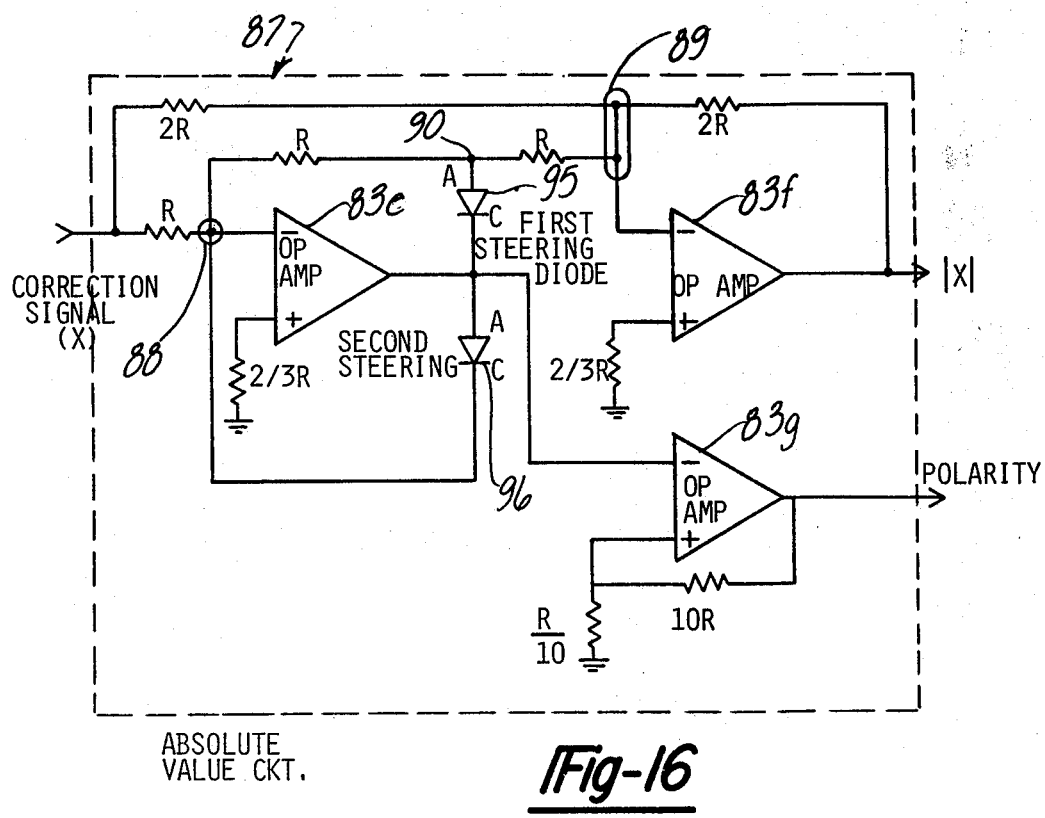
FIG. 16 is a schematic diagram of an absolute value circuit which may be embodied in the construction of our present invention.

The absolute value circuit 87, shown in FIG. 16, consists of a plurality of operational amplifiers connected to various circuit components. A first absolute value circuit operational amplifier 83e having a positive and negative input is provided. The positive input is connected to analog common through a resistor having a value of $\frac{2}{3}$ R as described hereinafter. The negative input of said operational amplifier 83e is connected to a first summing junction 88. The correction signal is supplied to the first summing junction 88 through a resistor having a value of R, and also to a second summing junction 89 through a resistor having a value of 2R. Also interposed between the first summing junction and the second summing junction are two resistors in series, both having a value of R. A first steering diode 95 is interposed between said two resistors at junction point 90 with the cathode of said first steering diode connected to the output of said first absolute value circuit operational amplifier 83e. There is also provided a second steering diode 96 having its cathode connected to said first summing junction 88 and its anode connected to the output of said first operational amplifier 83e. A second absolute value circuit operational amplifier 83f has its negative input connected to said second summing junction 89, and its positive input connected to analog common through a second resistor having a value of $\frac{2}{3}$ R. The output of said second operational amplifier 83f is also connected to said second summing junction 89 through a resistor having a value of 2R, and provides an output signal having an absolute value of the input correction signal. A third absolute value circuit operational amplifier 83g having its negative input connected to the output of said first operational amplifier 83e is provided. The positive input of said third operational amplifier 83g is connected to analog common through a resistor having a value of R/10, and a feedback loop is provided wherein there is interposed a resistor of value 10R. A polarity signal is taken off the output of said third operational amplifier 83g.

It is well known in the art that one does not want to operate an operational amplifier at its maximum current rating continuously because its reliability suffers a serious drop. Also, one does not want to operate it at too small a current because then such factors as noise, bias currents, and other considerations come into play. We prefer to operate the operational amplifiers at approximately 10% of their rating, and would choose the various resistors in the circuit to so limit the current. In order to do this, the value of any particular resistor would follow the relationship shown wherein the resistors are rated from R/10 to 10R with various values in between.

When the correction signal enters the absolute value circuit 87, the correction signal voltage is applied to the resistor R associated with the first absolute value circuit operational amplifier 83a. For a correction signal voltage greater than zero, the first operational amplifier circuit in effect has a gain factor of minus one and will cause the output of said circuit at junction point 90 to become the negative value of the input correction signal. The second operational amplifier circuit associated with summing junction 89 effectively provides an output voltage equal to the negative sum of the input correction voltage and twice the voltage at junction point 90. In this case where the input correction voltage is positive and the voltage at junction point 90 is negative, the output voltage is $-[CV+2(-CV)] = +CV$ where CV is a correction voltage greater than zero.

However, when the correction signal voltage is less than zero, the voltage at junction point 90 would become the positive value of the correction signal voltage except that now the steering diodes give the first operational amplifier circuit an effective gain factor of zero.

This results in the voltage at junction point 90 becoming zero. Now the output of the second operational amplifier circuit is $-[CV+2(0)] = -CV$ where CV is a correction voltage less than zero. Therefore, the output of the second operational amplifier circuit is a positive signal equal in amplitude to the input correction voltage which is commonly termed absolute value.

Since the output of the first operational amplifier 83e between the two steering diodes will always have the opposite polarity of the input correction signal, the negative polarity signal is fed to the negative input of the third operational amplifier 83g which, in effect, acts as a comparator. The output of the third operational amplifier 83g is caused to be saturated in the opposite polarity of its input since the resistors 10R and R/10 where chosen to obtain said saturated condition. This gives us a polarity signal as indicated in FIG. 6 with the same polarity as the correction signal.

Figure 13:
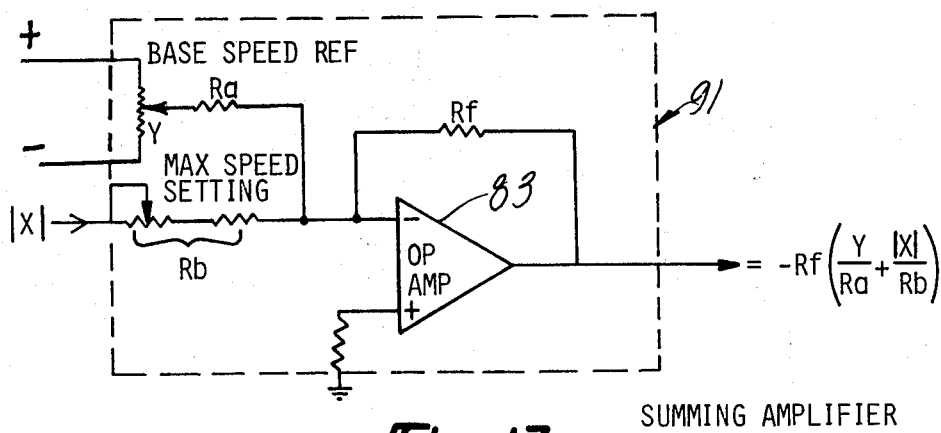
FIG. 13 shows a summing amplifier embodied in the construction of our present invention.

The absolute value signal from the absolute value circuit 87 is then supplied to the dead band comparator 92 which may be such as model No. AD311 manufactured by Analog Devices, Inc. previously mentioned. The function of said dead band comparator is to compare the absolute value of the correction signal with dead band reference values which have been supplied thereto by any suitable means. If the absolute value of the correction signal X is between zero and the dead band reference value, the dead band comparator acts to cause the process device 46 to remain in its present position by disabling the clock output. However, if the absolute value is not between zero and the dead band reference value, the absolute value of the correction signal is then supplied to the summing amplifier 91 shown in FIG. 13.

Summing amplifiers are common in the art and the components thereof, or its operation, need not be described herein in detail. It is to be noted, however, that the transfer function for the particular circuit used in this summing amplifier results in the equation:

$$\text{Output} = -Rf\left(\frac{Y}{Ra} + \frac{1 \times 1}{Rb}\right).$$

Thus, we now supply the signal from the summing amplifier 91 to the voltage to frequency converter 93 which may be such as the model No. AD537 manufactured by Analog Devices, Inc. of Bloomingdale, Ill., or any of several other devices known in the art. If the dead band comparator 92 has not previously caused the analog switch 94 to disable the output from said V/F converter 93, a clock signal will be supplied to the driver 45. The analog switch may be such as the model No. AD7513 manufactured by the aforementioned Analog Devices, Inc., or could be an equivalent transistor circuit well known in the art.

The clock signal and the polarity signal being supplied to the driver will ultimately be transferred to the operator 45, which in this case is a DC stepping motor, and will control the speed and direction at which said motor operates. Since the corrective action circuit shown in FIG. 6 is particularly adapted for driving a DC stepping motor, a stepping motor driver must be used in conjunction therewith. There are many stepping motor drivers such as those manufactured by the Superior Electric Co. of Bristol, Conn. and Sigma Instruments, Inc. of Braintree, Mass. However, the preferred embodiment of the present invention when a DC stepping motor is to be used, consists of a stepper translator connected to a quad 5ADC driver. These units are available commercially from Scans Associates, Inc., of Livonia, Mich., as stepper translator model No. 30086 and quad 5ADC driver model No. 30083. We have found this particular driver system to be very advantageous because of the fact that it is a higher performance system than others commercially available, and it has several other features, such as full or half stop operation, polarity reversal, and optically isolated outputs and inputs, which are very desirable in reducing noise effects in the system and allowing interconnection with and around machine control apparatus. Also, if desired, in place of the valid range check circuit 69, limit switches could be connected to this preferred driver system to prevent the ultimate process operating device 46 from exceeding the fully opened or fully closed type position.

Figure 17:
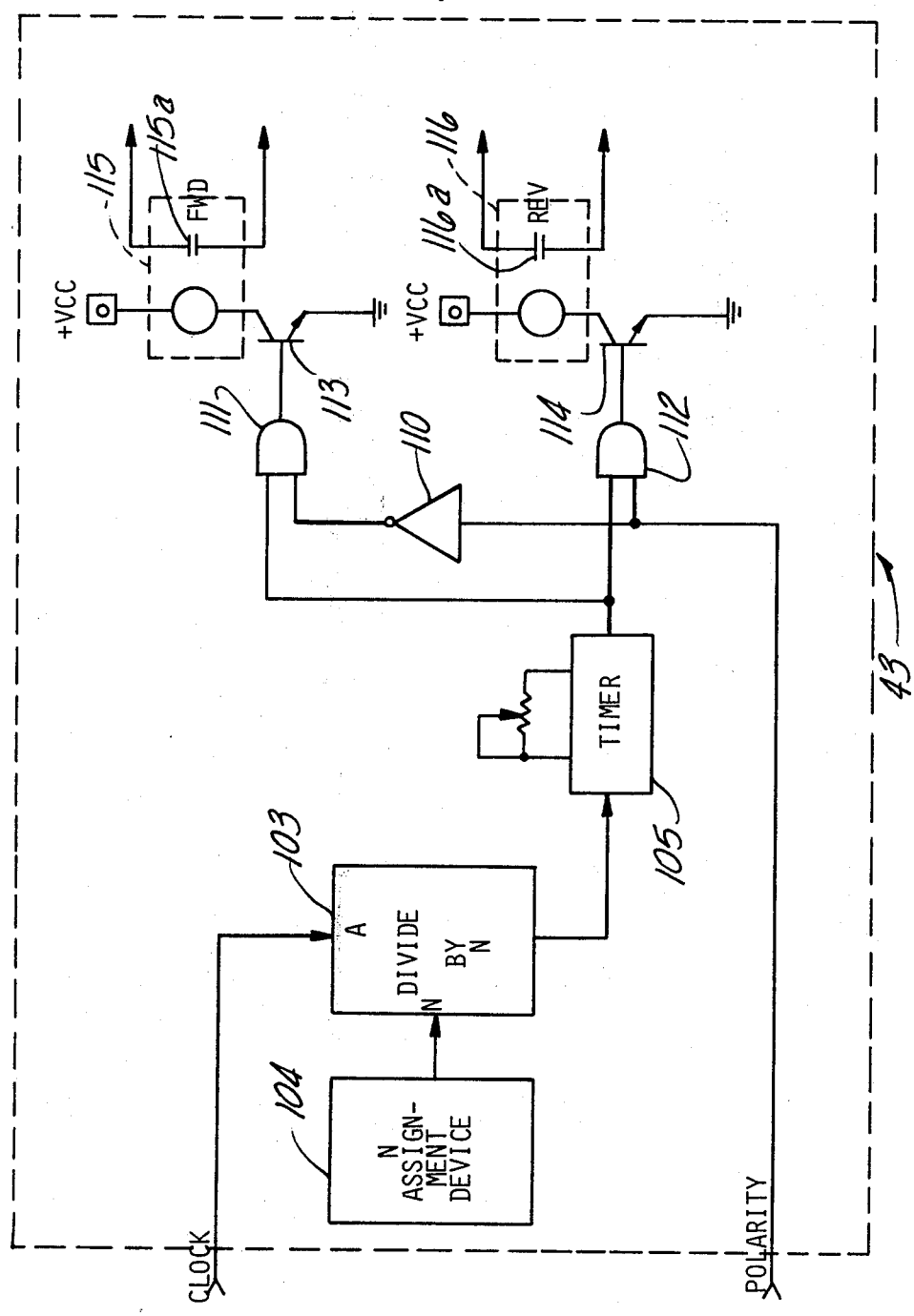
FIG. 17 is a schematic diagram of a two-directional switched driver which may be utilized in the construction of our present invention when a reversible AC synchronous motor or other reversible devices are to be utilized to control a process with our process controller.

If for reasons such as speed, torque, cost of the particular application or the like, the drivers so far described, which are all DC in nature, may not be applicable, it may be desirable to use a standard reversible motor other than a DC stepping motor in an incremental or step mode. Such a motor would normally be an AC motor which would require, in addition to the corrective action circuit shown in FIG. 6, a two directional switched driver which is shown in FIG. 17. In this instance, a divide by N circuit 103 is provided which may be the same as a Motorola model No. MC14522B or its equivalent. This circuit has the clock signal to one input, and an N assignment device 104, which may be a thumbwheel switch or other suitable switching device, connected to the preset inputs. The output of the divide by N circuit is connected to a retriggerable timer 105 which may be similar to Motorola model No. MC14528B or some similar device. This particular timer has proven to be desirable because it is of a programmable nature having provisions for an increment duration or magnitude adjustment. The output of the timer 105 is connected to one input each of a first two input and gate 111 and a second two input and gate 112. The polarity signal from the corrective action circuit is connected to the second input of the second two input and gate 112 and is also connected through an inverter 110 which may be such as Motorola model No. MC14049B to the second input of the first two input and gate 111 in the manner shown in FIG. 17. The output of the first two input and gate 111 is connected to the base of the first driver transistor 113. The emitter of said first driver transistor is connected to the logic common and the collector thereof is connected to a first driver relay 115 which may be such as the model No. 65630-22 manufactured by Hathaway Controls of Tulsa, Okla. The contact connections from the first driver relay may be used in many ways, three of which will be described below in regard to FIG. 18 through 21.

Similarly, the output of the second two input and gate 112 is connected to the base of the second driver transistor 114 which may be identical to the first driver transistor as is the case in the present embodiment. The emitter thereof is again connected to logic common with the collector being connected to the input of a second driver relay 116 which may be identical to the first, if desired. The contacts from the second driver relay 116 can be also used for any desired purpose. One particular use of the contacts from the first driver relay and the second driver relay which we have actually used is to connect them in the manner shown in FIG. 18 to an AC synchronous motor such as the model No. SS400RC manufactured by Superior Electric Co. of Bristol, Conn.

It should be understood, and will be understood by one skilled in the art that many of the components shown in the figures for which model numbers have been supplied can be substituted by many other substantially identical components having other model numbers and being manufactured by other manufacturers, and the circuitry of the present invention will perform as desired. Only the preferred embodiment has been shown herein, and some of the reasons for such preference have been given. Other reasons having to do with availability, cost, size, etc. also were taken into account by the Applicants.

It is contemplated that when a substitution is made, after appropriate substitution guides have been consulted, wiring diagrams for the particular device being substituted may be easily obtained from the literature supplied by the manufacturer of the particular device being used.

Figure 18:
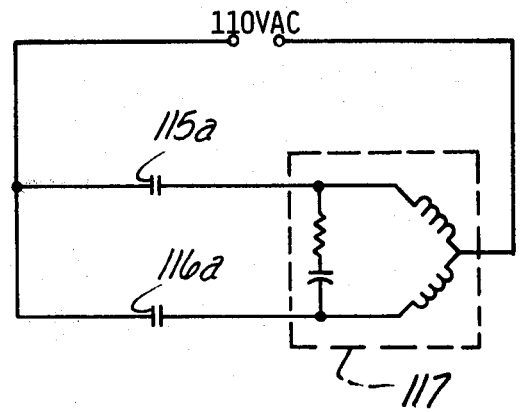
FIG. 18 is a schematic diagram of a reversible AC synchronous motor, which may be the operator controlled by our improved process controller.

Also, it should be understood in regard to FIG. 18 that the contacts from the first and second driver relay can be used in many other ways other than connecting them to the particular AC motor with which Applicants have experience. Examples of such uses are the use of most any reversible motor, or two direction actuator to control mechanical, pneumatic or hydraulic circuits. Such actuator may be rotational or nonrotational in nature.

Referring again to FIG. 17, our two direction switched driver would accept the input of the clock and polarity signals and the N input supplied by the N assignment device 104. The divide by N circuit puts out one pulse for every N input pulses and this serves to scale down the high frequency clock rate producing the increment rate. The scaled pulse rate is then used to trigger the retriggerable timer 105. The timer output is then gated with the above-mentioned polarity signal to produce separate forward and reverse output signals by means of the first and second two input and gates, the first and second driver transistors and the first and second driver relays. The signals, which are in the form of contact closures as previously mentioned, may be used to drive most any motor or two direction actuator by way of standard switching techniques. The increment magnitude adjustment is used to determine the duration of contact closure for each N clock pulses.

Figure 19:
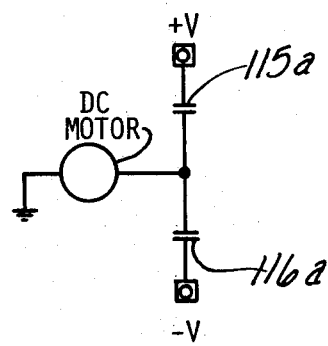
FIG. 19 is a schematic diagram of a reversible DC motor whose direction is controlled by a pair of relay contacts connected to opposite polarities.

A use of our two direction switched driver for controlling a DC motor may be such as that shown in FIG. 19 wherein the relay contact 115a which is understood to be the contact of the first driver relay 115 and the relay contact 116a, which is understood to be the relay contact of the second driver relay 116, are connected in the manner shown to a standard DC motor.

Figure 20:
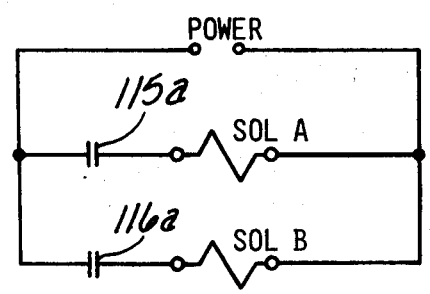
FIG. 20 is a schematic diagram showing how a pair of solenoids may be connected.
Figure 21:
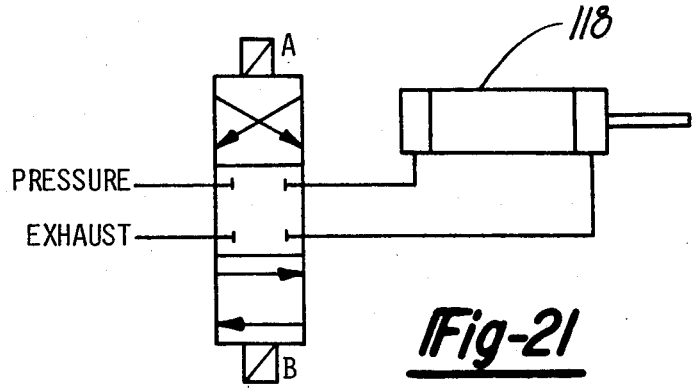
FIG. 21 is a diagrammatic view showing how the solenoids of FIG. 20 may be connected to operate a pneumatic or hydraulic cylinder.

If it is desired to operate pneumatic or hydraulic circuits incrementally with out two direction switched driver, the method of use illustrated in FIGS. 20 and 21 have been shown to be satisfactory, wherein the first driver relay contact 115a and the second driver relay contact 116a are connected as shown in FIG. 20 to a solenoid A and a solenoid B of a double solenoid value which are, in turn, connected to a pressure operated cylinder 118 in the manner shown in FIG. 21. When solenoid B is operating the position of the double solenoid valve shown in FIG. 21 causes pressure to enter the left-hand end of the cylinder 118, causing the piston thereof to move to the right and the cylinder to extend. When the solenoid A is operating, the valve shifts position causing the piston to move to the left and the cylinder to retract.

However, in certain processes it is desirable to use pneumatic control actuators such as the operator 45. This requires some changes in the corrective action circuit and results in the embodiment shown in FIGS. 7 and 8. When the pneumatic corrective action circuit shown in FIG. 7 is used, the correction signal from the differential input circuit 67 first passes into an absolute circuit 87, which is identical to that previously described in FIG. 16. The output of the absolute value circuit again is the absolute value of the corrective action signal and this is passed into the dead band comparator 92. The polarity output from the absolute value circuit is not used in this embodiment. In a manner similar to that previously described, the absolute value of the correction signal will be compared with the dead band reference and if it is between zero and the dead band reference the analog switch 94 is disabled. Therefore, no current can flow into the integrator 98 and no change in the output of the pneumatic corrective action circuit occurs, and thus the signal to the driver 43 is effectively frozen.

However, if the absolute value of the correction signal is greater than the dead band reference, the analog switch 94 is enabled allowing current to flow to the integrator 98. In this condition, the correction signal is supplied to the scaling circuit which, in effect, is a simple potentiometer well known in the art. Thus, the correction signal is reduced in value in a predetermined proportion and provides a properly scaled signal to the integrator 98.

Figure 14:
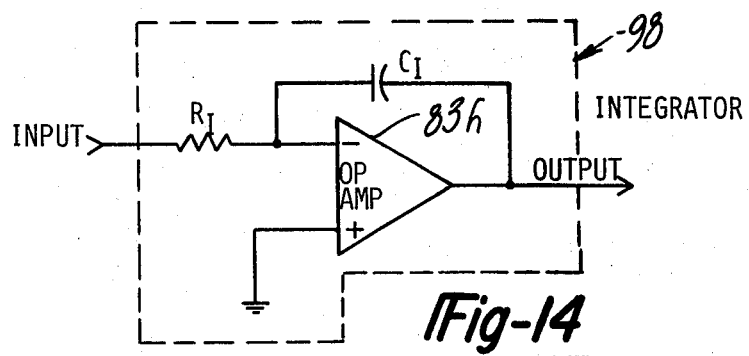
FIG. 14 is a schematic diagram showing an embodiment of an integrator as used in the construction of our present invention.

Referring to FIG. 14, the input to the integrator 98 passes through a resistor $R_I$ into the negative input of the integrator circuit operational amplifier 83h. A feedback loop containing a capacitor $C_I$ is provided from the output of the operational amplifier back to its negative input with its positive input connected to analog common. The effect of this is to change the input signal into a voltage signal representing the rate of change of the voltage. The values of $R_I$ and $C_I$ are chosen to provide a time constant for the circuit such that the process device 45 is capable of following the output signal through the driver 43. In general, the output is a function of $V/R_I C_I$ and time.

Figure 12:
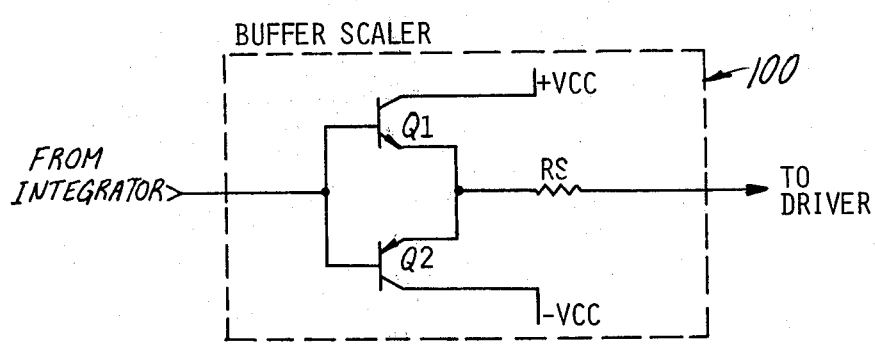
FIG. 12 is a schematic diagram of a buffer-scaler which may be embodied in the construction of our present invention.

The voltage signal out of the integrator 98 is then passed through a buffer-scaler 100 shown in more detail in FIG. 12. The buffer-scaler is, in effect, a bipolar driver follower composed of a NPN transistor Q1 such as a 2N4921 and a PNP transistor Q2 such as a model 2N4918 with their bases both connected to the input signal supplied from the integrator 98 and the emitters both connected to a scaling resistance $R_s$ which provides an output signal to the driver. The collector of Q1 is connected to plus VCC (power supply voltage) and the collector of Q2 is connected to minus VCC. Thus, a signal is provided to the driver 43 which in this case is a current to pressure converter such as a Moore Products Model No. 77 maufactured in Springhouse, Pa.

Figure 8:
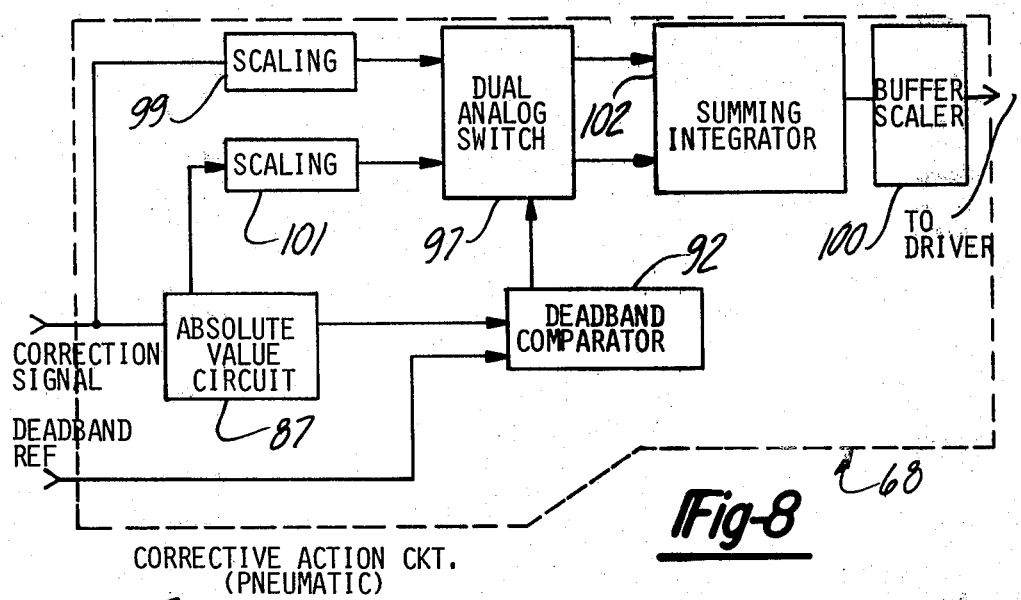
FIG. 8 shows another embodiment of a corrective action circuit which may be used in our novel process controller.

In a process where a pneumatic control device 45 and thus a pneumatic driver is necessary and a rate action is desirable, the embodiment shown in FIG. 8 has proven desirable. In this case, similar to that described in connection with FIG. 7, the correction signal from the differential input circuit is supplied to the absolute value circuit which, in the manner previously described in connection with FIG. 16, supplies an output equal to the absolute value of the correction signal and a polarity signal. The absolute value signal from the absolute value circuit is again supplied to a dead band comparator 92, and if the absolute value of the corretion signal is less than a dead band reference, the dual analog switch 97, which also may be such as model No. AD7513 manufactured by the aforementioned Analog Devices, Inc., disables both inputs to the summing integrator 102, thus resulting in the signal to the bufferscaler 100 being held constant, which ultimately results in no change being supplied to the operating device 45.

Figure 15:
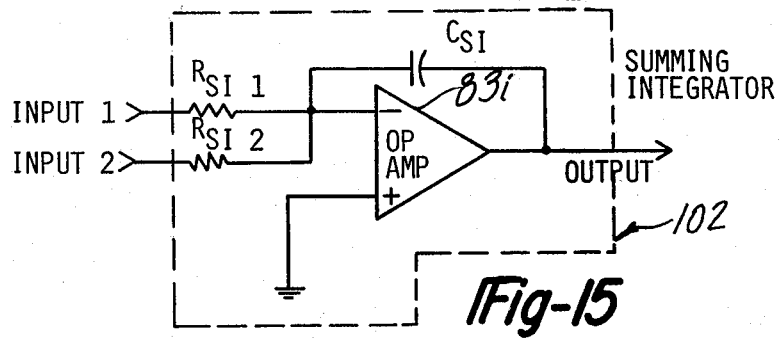
FIG. 15 is a schematic diagram of a summing integrator which may be used in the construction of our present invention.

However, if the absolute value of the correction signal is greater than the dead band reference, the analog switch will not disable the inputs to the summing integrator 102. In this case, referring again to FIG. 8, the correction signal is simultaneously fed to the scaling device 99, which may be identical to that shown in FIG. 7, and is, in effect, a potentiometer. This results in some change in magnitude of the correction signal being supplied to the analog switch. The saturated polarity signal from the absolute value circuit 87 is simultaneously being supplied to a second scaling device 101, resulting in a second input to the analog switch 97. This second signal will basically be a constant positive or negative signal depending on the polarity signal. With the analog switch in its enabled condition, both of these inputs are supplied to the summing integrator 102 such as that shown in FIG. 15. The summing integrator consists of a summing integrator circuit operational amplifier 83i having its positive input connected to analog common and a feedback loop having a capacitance $C_{si}$ interposed between its output and its negative input. The two input signals from the scaling devices 99 and 101 pass through the resistances $R_{si1}$ and $R_{si2}$, respectively, and are connected to the negative input. The values of the resistors and capacitors are again chosen in view of the considerations previously discussed dealing with the integrator shown in FIG. 14 and depending upon the particular application to which the process controller is to be put. The output of the summing integrator 102 is a function of $V_1/R_{si1}C_{si} + V_2/R_{si2}C_{si}$ and time. This voltage signal is supplied to the buffer-scaler 100, which performs the same operation on the signal as described in relation to FIG. 7. It can be seen that FIG. 8 is substantially similar to FIG. 7 except for the second scaling device 101. The function of said second scaling device is to provide a voltage input that effectively gives a minimum speed signal to the driver 43, causing the process device 45 to move by some minimum value when necessary. In a manner similar to that previously described, the driver may be such as a Moore Products current to pneumatic converter model 77. The driver, in turn, supplies a signal 48 to the process 44 as shown in any one of FIGS. 1 to 3, and the process correlate signal is continuously compared to the desired setting until the process is within the desired limits, thus completing the loop for any of the devices described.

Thus, by abandoning the old three-mode controllers previously used and developing our own novel controller which controls a process as a function of the difference of, and rate of change between, a desired value and a current state of the process, we have developed a controller which gives laboratory results on a production line basis.

We claim:

1. A method of controlling a process using a process controller including the steps of providing a desired value signal to said process controller related to the condition to which it is desired to set said process, providing a feedback signal to said process controller from the process being controlled indicating the current state of the process, producing a correction signal from said signals which will look ahead and attempt to become saturated as soon as a new desired value is supplied or a process change occurs by utilizing the rate of change of said signals and the error difference between said signals, which will remain unchanged as long as the process being controlled, and the desired value signal both remain unchanged and in a static condition, which will, if saturated, be brought out of saturation by utilizing said error difference and said rate of change in a manner to change said correction signal in value much faster than if said error difference only were used, and which will, if said process is in a dynamic condition, be changed in a series of occurrences to a value smaller in magnitude, but of either polarity, until it arrives at a value related to said condition it is desired to set said process to, and utilizing said correction signal to cause said process to arrive at said desired condition.

2. A process controller including means to accept a desired value signal related to a condition to which it is desired to set a process, means to accept a feedback signal related to the current state of the process, means to produce a correction signal from said signals which will look ahead and attempt to become saturated as soon as a new desired value is supplied or a process change occurs by utilizing the rate of change of said signals and the error difference between said signals, which will remain unchanged as long as the process being controlled, and the desired value signal both remain unchanged and in a static condition, which will, if saturated, be brought out of saturation by utilizing said error difference and said rate of change in a manner to change said correction signal in value much faster than if said error difference only were used, and which will, if said process is in a dynamic condition, be changed in a series of occurrences to a value smaller in magnitude, but of either polarity, until it arrives at a value related to said condition it is desired to set said process to, and utilizing said correction signal to cause said process to arrive at said desired condition.

3. The method defined in claim 1, wherein the step of providing a desired value signal to said process controller includes the steps of providing a desired value setting device capable of supplying a reference voltage signal, connecting said desired value setting device in an appropriate manner to said process controller, and setting said desired value setting device at a position such that the desired voltage reference signal will be the output therefrom.

4. The method defined in claim 3, wherein the steps of providing a desired value setting device and connecting said desired value setting device include the steps of providing a potentiometer and directly connecting said potentiometer to said process controller.

5. The method defined in claim 1, wherein the step of providing a desired value signal to said process controller includes the steps of providing a desired value setting device capable of supplying a refernce voltage signal, connecting to said desired value setting device an automation device to automatically change said reference voltage signal in said desired value setting device to a value appropriate to a next condition upon the completion of a test, and connecting said desired value setting device to said process controller.

6. The method defined in claim 1, wherein the step of providing a feedback signal to said process controller includes the steps of providing a process measurement device capable of measuring the current state of the process being controlled, causing said process measurement device to supply a process correlate signal related to the current condition of the process, causing said process correlate signal to either be directly supplied to said process controller or to a feedback signal device capable of converting or signal conditioning said process correlate signal into a signal usable by and directly supplied to said process controller such that said signal supplied to said process controller is said feedback signal related to the current state of the process being controlled.

7. The method defined in claim 1, wherein the step of utilizing said desired value and feedback signals to produce a correction signal includes the steps of providing an error and rate amplifier circuit, supplying said error and rate amplifier circuit with said desired value and feedback signals, and yielding a correction signal related to the algebraic sum of the actual error difference and the rate of change of said actual error difference between said feedback and desired value signals.

8. The method defined in claim 1, wherein the step of utilizing said desired value and feedback signals to produce a correction signal includes the steps of providing an error and rate amplifier circuit, providing a valid range check circuit, supplying said desired value and said feedback signals into said error and rate amplifier circuit, supplying high limit and low limit set points and said desired value signal into said valid range check circuit, providing an output from said valid range check circuit adapted to produce a saturation override signal if the desired value is outside said high or low limit set points, supplying said saturation override signal to said error and rate amplifier circuit, causing said error and rate amplifer circuit to provide a correction signal which is saturated when said desired value signal is either above said high limit set point or below said low limit set point, and causing said error and rate amplifier circuit to provide a correction signal related to the algebraic sum of the actual error difference and the rate of change of said actual error difference between said feedback and desired value signals when said desired value signal is within said high and low limit set points.

9. The method defined in claim 8, wherein the step of providing said error and rate amplifier circuit includes the steps of providing a first operational amplifier having positive and negative inputs and an output, providing a second operational amplifier having positive and negative inputs and an output, providing an instrumentation amplifier having positive and negative inputs, an output, and a rate plus proportional gain adjust, connecting said desired value signal to said positive input of said first operational amplifier, connecting said feedback signal to said positive input of said second operational amplifier, interposing a capacitor between said negative inputs of said first and said second operational amplifiers, interposing a first variable feedback resistor between said output and said negative input of said first operational amplifier, interposing a second variable feedback resistor between said output and said negative input of said second operational amplifier, connecting said saturation override signal to said positive input of said instrumentation amplifier, and interposing a resistance between said output of said second operational amplifier and said positive input of said instrumentation amplifier, thereby obtaining said correction signal from said output of said instrumentation amplifier.

10. The method defined in claim 1, wherein the step of utilizing said correction signal to cause said process to arrive at said desired condition includes the steps of providing a corrective action circuit, determining the absolute value of said correction signal, continuously comparing said absolute value of said correction signal with a deadband reference value, changing the output of said correction action circuit if said absolute value of said correction signal is above said deadband reference, not changing the output of said corrective action circuit if said absolute value is between zero and said deadband reference value, and utilizing said output to cause said process to arrive at said desired condition.

11. The method defined in claim 1, wherein the step of utilizing said correction signal to cause said process to arrive at said desired condition includes the steps of providing a corrective action circuit, supplying said correction signal to an absolute value circuit and to an analog switch through a scaling device, providing a connection between the output of said analog switch and an integrator, determining the absolute value of said correction signal, continuously comparing the absolute value of said correction signal with a deadband reference value, causing said analog switch to be enabled if the absolute value of said correction signal is above said deadband reference value thereby permitting a current flow proportional to said correction signal to enter said integrator and permit a change in the output of said corrective action circuit, causing said analog switch to be disabled if the absolute value of said correction signal is between zero and said deadband reference value, thereby permitting no current to flow from said analog switch to said integrator and permit no change in the output of said corrective action circuit to take place, and utilizing said output to cause said process to arrive at said desired condition.

12. The method defined in claim 1, wherein the step of utilizing said correction signal to cause said process to arrive at said desired condition includes the steps of providing a correction action circuit, supplying said correction signal to an absolute value circuit and to a dual analog switch through a first scaling device, providing connections between said dual analog switch and a summing integrator, determining the absolute value of said correction signal, providing a polarity signal to said dual analog switch through a second scaling device equal to the polarity of said correction signal, continuously comparing the absolute value of said correction signal with a deadband reference value, causing said dual analog switch to be enabled if the absolute value of said correction signal is above said deadband reference value thereby permitting a first current flow proportional to said correction signal to enter said summing integrator, permitting a second current flow proportional to said polarity signal to enter said summing integrator and permitting a change in the output of said corrective action circuit, causing said dual analog switch to be disabled if the absolute value of said correction signal is between zero and said deadband reference value, thereby permitting no current to flow from said dual analog switch to said summing integrator and permitting no change in the output of said corrective action circuit, and utilizing said output to cause said process to arrive at said desired condition.

13. The method defined in claim 1, wherein the step of utilizing said correction signal to cause said process to arrive at said desired condition includes the steps of providing a corrective action circuit, determining the absolute value of said correction signal, providing a polarity signal corresponding to the polarity of said correction signal, continuously comparing the absolute value of said correction signal with a deadband reference value, providing a clock output signal if the absolute value of said correction signal is greater than said deadband reference value, providing no clock output signal if the absolute value of said correction signal is between zero and said deadband reference value, and utilizing said clock output and said polarity signals to cause said process to arrive at said desired condition.

14. The method defined in any one of claims 10–13, wherein the step of determining the absolute value of said correction signal includes the steps of providing a first absolute value circuit operational amplifier having a positive and negative input and an output, providing a second absolute value circuit operational amplifier having a positive and negative input and an output, connecting said positive input of said first absolute value circuit operational amplifier to analog common through a resistor having a value of ⅔ R, connecting said positive input of said second absolute value circuit operational amplifier to analog common through a resistor having a value of ⅔ R, connecting said negative input of said first absolute value circuit operational amplifier to a first summing junction, supplying said correction signal to a second summing junction through a resistor having a value of 2R and to said first summing junction through a resistor having a value of R, connecting between said first summing junction and said second summing junction two resistors in series, both having a value of R, providing a first steering diode having its anode connected to the junction of said two resistors in series and its cathode connected to said output of said first absolute value circuit operational amplifier, providing a second steering diode having its cathode connected to said first summing junction and its anode connected to the output of said first absolute value circuit operational amplifier, connecting the negative input of said second absolute value circuit operational amplifier to said second summing junction, connecting the output of said second absolute value circuit operational amplifier to said second summing junction through a resistor having a value of 2R, thereby causing the output of said second absolute value circuit amplifier to be the absolute value of said correction signal in which the magnitude is equal to or exceeds zero.

15. The method defined in claim 13, wherein the steps of determining the absolute value of said correction signal and providing a polarity signal corresponding to the polarity of said correction signal includes the steps of providing a first absolute value circuit operational amplifier having a positive and negative input and an output, providing a second absolute value circuit operational amplifier having a positive and negative input and an output, providing a third absolute value circuit operational amplifier having a positive and negative input and an output, connecting said positive input of said first absolute value circuit operational amplifier to analog common through a resistor having a value of ⅔ R, connecting said positive input of said second absolute value circuit operational amplifier to analog common through a resistor having a value of ⅔ R, connecting said negative input of said first absolute value circuit operational amplifier to a first summing junction, supplying said correction signal to a second summing junction through a resistor having a value of 2R and to said first summing junction through a resistor having a value of R, connecting between said first summing junction and said second summing junction two resistors in series, both having a value of R, providing a first steering diode having its anode connected to the junction of said two resistors in series and its cathode connected to said output of said first absolute value circuit operational amplifier, providing a second steering diode having its cathode connected to said first summing junction and its anode connected to the output of said first absolute value circuit operational amplifier, connecting the negative input of said second absolute value circuit operational amplifier to said second summing junction, connecting the output of said second absolute value circuit operational amplifier to said second summing junction through a resistor having a value of 2R, thereby causing the output of said second absolute value circuit amplifier to be the absolute value of said correction signal in which the magnitude is equal to or exceeds zero, connecting the output of said first absolute value circuit operational amplifier to the negative input of said third absolute value circuit operational amplifier, connecting the positive input of said third absolute value circuit operational amplifier to analog common through a resistor having a value of R/10, forming a feedback loop by interposing a resistor having a value of 10R between said output and said positive input of said third absolute value circuit operational amplifier and obtaining a polarity signal from the output of said third absolute value circuit operational amplifier corresponding to the polarity of said correction signal.

16. The method defined in any one of claims 1, or 3–12, wherein the step of utilizing said output to cause said process to arrive at said desired condition includes the steps of providing a driver, connecting said driver to an operator adapted to a process device, and supplying said output signal to said driver to cause said process to arrive at said desired condition.

17. The method defined in claim 13, wherein the step of utilizing said clock output and said polarity signals to cause said process to arrive at said desired condition includes the steps of providing a driver, connecting said driver to an operator adapted to a process device, and supplying said clock and said polarity signals to said driver to cause said process to arrive at said desired condition.

18. The method defined in claim 17, wherein said operator is in the form of a DC stepping motor, and said driver is in the form of a stepping motor driver adapted to receive said clock and said polarity signals to control said operator.

19. The method defined in claim 18, wherein said stepping motor driver includes a stepper translator connected to a quad 5ADC driver and adapted to receive said clock and said polarity signals and to control said operator.

20. The method defined in claim 17, wherein said operator is in the form of an AC synchronous motor.

21. The method defined in claim 17, wherein the step of providing a driver includes providing a two-directional switched driver.

22. The method defined in claim 21, wherein the step of supplying a two-directional switched driver includes the steps of providing a divide by N circuit having an input, a preset input, and an output, connecting the clock signal to said input, connecting an N assignment device to said preset input, providing a retriggerible timer having an input and an output with said input connected to said output of said divide by N circuit, providing a first two input AND gate, providing a second two input AND gate, connecting the output of said retriggerible timer to one input each of said first two input and said second two input AND gates, connecting the polarity signal to the second input of said two input AND gate and to the input of an inverter gate, connecting the output of said inverter gate to the second input of said first two input AND gate, providing a first driver transistor having an emitter, a base and a collector, connecting said output of said first two input AND gate to the base of said first driver transistor, providing a first driver relay having a pair of contact connections, connecting said collector of said first driver transistor to said first driver relay, providing a second driver transistor having an emitter, a base, and a collector, connecting said output of said second two input AND gate to said base of said second driver transistor, providing a second driver relay having an input and a pair of contacts, connecting said collector of said second driver transistor to said input of said second driver relay, and connecting the emitter of said first and said second driver transistors to logic common.

23. The method defined in claim 3, wherein the step of providing a feedback signal to said process controller includes the steps of providing a process measurement device capable of measuring the current state of the process being controlled, causing said process measurement device to supply a process correlate signal related to the current condition of the process, causing said process correlate signal to either be directly supplied to said process controller or to a feedback signal device capable of converting or signal conditioning said process correlate signal into a signal usable by and directly supplied to said process controller such that said signal supplied to said process controller is said feedback signal related to the current state of the process being controlled.

24. The method defined in claim 23, wherein the step of utilizing said desired value and feedback signals to produce a correction signal includes the steps of providing an error and rate amplifier circuit, providing a valid range check circuit, supplying said desired value and said feedback signals into said error and rate amplifier circuit, supplying high limit and low limit set points and said desired value signal into said valid range check circuit, providing an output from said valid range check circuit adapted to produce a saturation override signal if the desired value is outside said high or low limit set points, supplying said saturation override signal to said error and rate amplifier circuit, causing said error and rate amplifier circuit to provide a correction signal which is saturated when said desired value signal is either above said high limit set point or below said low limit set point, and causing said error and rate amplifier circuit to provide a correction signal related to the algebraic sum of the actual error difference and the rate of change of said actual error difference between said feedback and desired value signals when said desired value signal is within said high and low limit set points.

25. The method defined in claim 24, wherein the step of utilizing said correction signal to cause said process to arrive at said desired condition includes the steps of providing a corrective action circuit, determining the absolute value of said correction signal, continuously comparing said absolute value of said correction signal with a deadband reference value, changing the output of said correction action circuit if said absolute value of said correction signal is above said deadband reference, not changing the output of said corrective action circuit if said absolute value is between zero and said deadband reference value, and utilizing said output to cause said process to arrive at said desired condition.

26. The method defined in claim 24, wherein the step of utilizing said correction signal to cause said process to arrive at said desired condition includes the steps of providing a corrective action circuit, supplying said correction signal to an absolute value circuit and to an analog switch through a scaling device, providing a connection between the output of said analog switch and an integrator, determining the absolute value of said correction signal, continuously comparing the absolute value of said correction signal with a deadband reference value, causing said analog switch to be enabled if the absolute value of said correction signal is above said deadband reference value thereby permitting a current flow proportional to said correction signal to enter said integrator and permit a change in the output of said corrective action circuit, causing said analog switch to be disabled if the absolute value of said correction signal is between zero and said deadband reference value, thereby permitting no current to flow from said analog switch to said integrator and permit no change in the output of said corrective action circuit to take place, and utilizing said output to cause said process to arrive at said desired condition.

27. The device defined in claim 2, wherein said means to accept a desired value signal includes a desired value setting device adapted to supply for acceptance by said process controller a voltage reference indicating a desired value.

28. The device defined in claim 27, wherein said desired value setting device is a potentiometer.

29. The device defined in claim 2, wherein said means to accept a desired value signal includes a desired value setting device adapted to supply for acceptance by said process controller a voltage reference and an automation device adapted to automatically change said voltage reference to a value appropriate to a next condition upon completion of a test.

30. The device defined in claim 2, wherein said means to accept a feedback signal includes a process measurement device adapted to provide a process correlate signal and to supply for acceptance by said process controller a voltage signal indicating a feedback value related to the current state of the process.

31. The device defined in claim 2, wherein said means to accept a feedback signal includes a process measurement device adapted to provide a process correlate signal related to the current condition of the process and a feedback signal device adapted to convert said process correlate signal to a voltage signal and to supply for acceptance by said process controller said voltage signal indicating a feedback value related to the current state of the process.

32. The device defined in claim 31, wherein said feedback signal device is a pressure transducer.

33. The device defined in claim 2, wherein the means to produce a correction signal includes a differential input circuit adapted to determine the error difference between said desired value signal and said feedback signal, determine the rate of change of said error difference, and supply said correction signal related to said error difference and said rate of change of said error difference.

34. The device defined in claim 33, wherein said differential input circuit includes an error and rate amplifier circuit, means to accept said feedback signal connected to said error and rate amplifier circuit, and means to accept said desired value signal connected to said error and rate amplifier circuit, all adapted to enable said error and rate amplifier circuit to provide a correction signal.

35. The device defined in claim 33, wherein said differential input circuit includes an error and rate amplifier circuit, a valid range check circuit, means to accept said feedback signal connected to said error and rate amplifier circuit, means to accept said desired value signal connected to said error and rate amplifier circuit, all adapted to enable said error and rate amplifier circuit to provide a correction signal.

36. The device defined in claim 33, wherein said differential input circuit includes an error and rate amplifier circuit, a valid range check circuit, a scaling and meter protection circuit, means to accept said feedback signal connected to said error and rate amplifier circuit and to said scaling and meter protection circuits, means to accept said desired value signal connected to said error and rate amplifier circuit and to said scaling and meter protection circuit, all adapted to enable said error and rate amplifier circuit to provide a correction signal and to enable said scaler and meter protection circuit to provide a deviation meter output signal.

37. The device defined in claim 36, wherein said scaling and meter protection circuit includes a first scaling operational amplifier having positive and negative inputs and an output, a second scaling operational amplifier having positive and negative inputs and an output, said desired value signal connected to said positive input of said first scaling operational amplifier, said feedback signal connected to said positive input of said second scaling operational amplifier, a first current limiting resistor connected to the output of said first scaling circuit operational amplifier, a second current limiting resistor connected to the output of said second scaling circuit operational amplifier, the negative input of said first scaling operational amplifier connected to said first current limiting resistor, the negative input of said second scaling circuit operational amplifier connected to said second current limiting resistor, and a scaling resistor connected to said negative input of said operational amplifier, all adapted to supply a differential output which is in the form of voltage and has limited current capacity such that a meter will not be over ranged.

38. The device defined in any one of claims 35-36, wherein said valid range check circuit includes a high limit comparator having positive and negative inputs and an output, a low limit comparator having positive and negative inputs and an output, a high limit set point connected to the positive input of said high limit comparator, a low limit set point connected to the positive input of said low limit comparator, said desired value signal connected to the negative input of said high limit and of said low limit comparator, a high limit diode having its cathode connected to said output of said high limit comparator, a low limit diode having its anode connected to the output of said low limit comparator, the anode of said high limit diode and the cathode of said low limit diode being connected together to form the saturation override signal supplied to said error and rate amplifier circuit, all adapted to act in a manner to cause the correction signal to become saturated if said desired value signal is outside said high limit or said low limit set points, but to operate in a normal mode supplying said correction signal if said desired value is within said high limit and said low limit set points.

39. The device defined in any one of claims 35-37, wherein said error and rate amplifier circuit includes an instrumentation amplifier having a positive and a negative input, a rate plus proportional gain adjust, and an output, a first operational amplifier having a positive and negative input and an output, a second operational amplifier having a positive and a negative input and an output, said desired value signal connected to the positive input of said first operational amplifier, said feedback signal connected to said positive input of said second operational amplifier, a capacitor connected between said negative inputs of said first and second operational amplifiers, a first variable feedback resistor connected between said output and said negative input of said first operational amplifier, a second variable feedback resistor connected between said output and said negative input of said second operational amplifier, a saturation override signal connected to said positive input of said instrumentation amplifier, a resistance connected between said output of said second operational amplifier and said positive input of said instrumentation amplifier, all adapted to supply from the output of said instrumentation amplifier a correction signal as a function of $G[(F-DV)+C_1\times(R_1+R_2)\times d(F-DV/dt)]$.

40. The device defined in claim 2, wherein means to produce said correction signal include a corrective action circuit adapted to provide signals to a driving means to adjust a process device.

41. The device defined in claim 40, wherein said corrective action circuit is adapted to provide signals to a driving means to operate a stepping motor or a reversible device to adjust the process device and includes an absolute value circuit having an input adapted to receive said correction signal and having outputs consisting of a polarity signal and a signal equivalent to the absolute value of the correction signal, a deadband comparator having an input and an output with the input connected to the output of said absolute value circuit, means to supply deadband reference values to said deadband comparator, a summing amplifier having an input and an output, with the input connected to the output of said absolute value circuit, a voltage to frequency converter having an input and an output with the input connected to the output of said summing amplifier, an analog switch having an input, a control input and an output with the output in the form of a clock signal, with said input being connected to the output of said voltage to frequency converter and said control input being connected to the output of said deadband comparator, with said clock signal and said polarity signal supplied to said driving means thereby adjusting said process device.

42. The device defined in claim 41, wherein said driving means consists of a stepping motor translator.

43. The device defined in claim 42, wherein said stepping motor translator consists of a stepper translator connected to a quad 5ADC driver.

44. The device defined in claim 41, wherein said driving means consists of a two directional switched driver.

45. The device defined in claim 40, wherein said corrective action circuit is adapted to provide signals to a driving means to operate an operator which is pneumatic in nature or requires a variable reference signal to adjust the process device and includes an absolute value circuit having an input adapted to receive said correction signal and an output, a scaling circuit having an input and an output, the input of said scaling circuit also connected to said correction signal, an analog switch having an input, a control input, and an output, the input thereof being connected to said scaling circuit, a deadband comparator having an input and an output, with the input thereof connected to the output of said absolute value circuit and the output thereof connected to said control input of said analog switch, a means to supply deadband reference values to said deadband comparator, an integrator having an input and an output with the input thereof being connected to the output of said analog switch, a buffer-scaler having an input and an output with the input thereof connected to the output of said integrator circuit, and the output thereof supplying a signal to said driving means thereby adjusting said process device.

46. The device defined in claim 40, wherein said corrective action circuit is adapted to provide signals to a driving means to operate an operator which is pneumatic in nature or requires a variable reference signal to adjust the process device and includes an absolute value circuit having an input adapted to receive said correction signal, a first scaling device connected to said input of said absolute value circuit, a second scaling device having an input and an output with the input thereof connected to said absolute value circuit, a dual analog switch having its two inputs connected to the outputs of said first and said second scaling device and having two outputs, a deadband comparator having an input and an output with the input thereof connected to the output of said absolute value circuit and to the control input of said dual analog switch, means to supply said deadband comparator with deadband reference values, a summing integrator having an input and an output with the input thereof connected to said outputs of said dual analog switch, a buffer-scaler having an input and an output with the input of said buffer-scaler connected to the output of said summing integrator, and the output of said buffer-scaler adapted to supply a signal to said driving means thereby adjusting said process device.

47. The device defined in any one of claims 41-46, wherein said absolute value circuit includes a first absolute value circuit operational amplifier having positive and negative inputs and an output, and analog common, a resistor having a value of $\frac{2}{3}$ R connected between the positive input of said first absolute value circuit operational amplifier and analog common, a first summing junction, a connection between the negative input of said first absolute value circuit operational amplifier and said first summing junction, a resistor having a value of R adapted to receive said correction signal and connected to said first summing junction, a second summing junction 89, a resistor of value 2R interposed between said resistor of value R and said second summing junction, a junction point, a first resistor of value R interposed between said junction point and said first summing junction, a second resistor of value R interposed between said junction point and said second summing junction, a first steering diode having an anode and a cathode with said anode connected to said junction point and with said cathode connected to the output of said first absolute value circuit operational amplifier, a second steering diode having an anode and a cathode with its cathode connected to said first summing junction and its anode connected to the output of said first operational amplifier, a second absolute value circuit operational amplifier having positive and negative inputs and an output, with said negative input connected to said second summing junction, a resistor having a value of $\frac{2}{3}$ R interposed between analog common and the positive input of said second absolute value operational amplifier, a resistor of value 2R interposed between said output of said second absolute value circuit operational amplifier and said second summing junction, all adapted to provide a signal corresponding to the absolute value of said correction signal at the output of said second absolute value circuit operational amplifier.

48. The device defined in any one of claims 41-46 wherein said absolute value circuit includes a first absolute value circuit operational amplifier having positive and negative inputs and an output, an analog common, a resistor having a value of $\frac{2}{3}$ R connected between the positive input of said first absolute value circuit operational amplifier and analog common, a first summing junction, a connection between the negative input of said first absolute value circuit operational amplifier and said first summing junction, a resistor having a value of R adapted to receive said correction signal and connected to said first summing junction, a second summing junction 89, a resistor of value 2R interposed between said resistor of value R and said second summing junction, a junction point, a first resistor of value R interposed between said junction point and said first summing junction, a second resistor of value R interposed between said junction point and said second summing junction, a first steering diode having an anode and a cathode with said anode connected to said junction point and with said cathode connected to the output of said first absolute value circuit operational amplifier, a second steering diode having an anode and a cathode with its cathode connected to said first summing junction and its anode connected to the output of said first operational amplifier, a second absolute value circuit operational amplifier having positive and negative inputs and an output, with said negative input connected to said second summing junction, a resistor having a value of $\frac{2}{3}$ R interposed between analog common and the positive input of said second absolute value operational amplifier, a resistor of value 2R interposed between said output of said second absolute value circuit operational amplifier and said second summing junction, a third absolute value circuit operational amplifier having positive and negative inputs and an output, the negative input of said third absolute value circuit operational amplifier being connected to the output of said first absolute value circuit operational amplifier, a resistor having a value of R/10 connected between the positive input of said third operational amplifier and analog common, and a resistor of value 10R interposed between the output of said third absolute value circuit operational amplifier and its positive input, all adapted to provide a polarity signal at the output of said third absolute value circuit operational amplifier and to provide a signal corresponding to the absolute value of said correction signal at the output of said second absolute value circuit operational amplifier.

49. The device defined in claim 41, wherein said summing amplifier includes an operational amplifier having a positive and negative input and an output, with said positive input connected to analog common through a resistor, a voltage follower circuit including the resistance Rf interposed between said output and said negative input of said operational amplifier, an adjustable resistance having the value Rb connected to the negative input of said operational amplifier and adapted to receive said correction signal, and a base speed reference device also being connected through a resistor Ra to said negative input of said operational amplifier, all adapted to produce an output from said operational amplifier according to the function $-Rf(Y+X/Ra\, Rb)$.

50. The device defined in claim 45, wherein said integrator includes an integrator operational amplifier having positive and negative inputs and an output with said positive input of said integrator operational amplifier being connected to analog common, a capacitance having a value of $C_I$ being connected from said negative input of said integrator operational amplifier to said output thereof, and a resistance having a value of $R_I$ being connected to said negative input of said operational amplifier.

51. The device defined in claim 46, wherein said summing integrator includes a summing integrator operational amplifier having positive and negative inputs and an output with the positive input of said summing integrator operational amplifier being connected to analog common, a pair of resistances having values of $R_{S11}$ and $R_{S12}$ connected to the negative input of said summing integrator operational amplifier, and a capacitance of a value CsI interposed between said negative input of said summing integrator operational amplifier and said output.

52. The device defined in any one of claims 45-46, wherein said buffer scaler includes an NPN transistor, a PNP transistor, the output signal from the integrator or summing integrator supplied to the base of both transistors, the collector of said NPN transistor connected to the positive power supply voltage, the collector of said PNP transistor connected to negative power supply voltage, and the emitters of both transistors connected to a scaling resistance Rs which provides an output signal to said driving means.

53. The device defined in claim 44, wherein the two directional switched driver consists of a divide by N circuit having an input, a preset input, and an output, said clock signal from said corrective action circuit being connected to said input of said divide by N circuit, an N assignment device connected to said preset input of said divide by N circuit, a retriggerible timer having an input and an output with said output of said divide by N circuit being connected to said input of said timer, a first two input AND gate and a second two input AND gate, said output of said timer connected to one input each of said first and said second two input AND gates, said polarity signal from said corrective action circuit connected to said second input of said second two input AND gate, an inverter having an input and an output, with said polarity signal from said corrective action circuit also being connected to said input of said inverter, and said output of said inverter being connected to said second input of said second two input AND gate, a first driver transistor having an emitter, a base and a collector, said output of said first two input AND gate connected to said base of said first driver transistor, said emitter of said first driver transistor connected to logic common, said output of said second two input AND gate connected to the base of said second driver transistor, said emitter of said second driver transistor being connected to logic common, a first driver relay connected to said collector of said first driver transistor, a second driver relay connected to said collector of said second driver transistor, and contact connections provided on said first driver relay and on said second driver relay for operating said operator thereby adjusting said process device.

54. The device defined in claim 27, wherein said means to accept a feedback signal includes a process measurement device adapted to provide a process correlate signal related to the current condition of the process and a feedback signal device adapted to convert said process correlate signal to a voltage signal and to supply for acceptance by said process controller said voltage signal indicating a feedback value related to the current state of the process.

55. The device defined in claim 54, wherein the means to utilize said desired value and said feedback signal to produce a correction signal includes a differential input circuit adapted to determine the error difference between said desired value signal and said feedback signal, determine the rate of change of said error difference, and supply said correction signal related to said error difference and said rate of change of said error difference.

56. The device defined in claim 55, wherein said differential input circuit includes an error and rate amplifier circuit, a valid range check circuit, a scaling and meter protection circuit, means to accept said feedback signal connected to said error and rate amplifier circuit and to said scaling and meter protection circuits, means to accept said desired value signal connected to said error and rate amplifier circuit and to said scaling and meter protection circuit, all adapted to enable said error and rate amplifier circuit to provide a correction signal and to enable said scaler and meter protection circuit to provide a deviation meter output signal.

57. The device defined in claim 56, wherein said scaling and meter protection circuit includes a first scaling operational amplifier having positive and negative inputs and an output, a second scaling operational amplifier having positive and negative inputs and an output, said desired value signal connected to said positive input of said first scaling operational amplifier, said feedback signal connected to said positive input of said second scaling operational amplifier, a first current limiting resistor connected to the output of said first scaling circuit operational amplifier, a second current limiting resistor connected to the output of said second scaling circuit operational amplifier, the negative input of said first scaling operational amplifier connected to said first current limiting resistor, the negative input of said second scaling circuit operational amplifier connected to said second current limiting resistor, and a scaling resistor connected to said negative input of said operational amplifier, all adapted to supply a differential output which is in the form of voltage and has limited current capacity such that a meter will not be over ranged.

58. The device defined in claim 57, wherein said valid range check circuit includes a high limit comparator having positive and negative inputs and an output, a low limit comparator having positive and negative inputs and an output, a high limit set point connected to the positive input of said high limit comparator, a low limit set point connected to the positive input of said low limit comparator, said desired value signal connected to the negative input of said high limit and of said low limit comparator, a high limit diode having its cathode connected to said output of said high limit comparator, a low limit diode having its anode connected to the output of said low limit comparator, the anode of said high limit diode and the cathode of said low limit diode being connected together to form the saturation override signal supplied to said error and rate amplifier circuit, all adapted to act in a manner to cause the correction signal to become saturated if said desired value signal is outside said high limit or said low limit set points, but to operate in a normal mode supplying said correction signal if said desired value is within said high limit and said low limit set points.

59. The device defined in claim 58, wherein said error and rate amplifier circuit includes an instrumentation amplifier having a positive and a negative input, a rate plus proportional gain adjust, and an output, a first operational amplifier having a positive and negative input and an output, a second operational amplifier having a positive and a negative input and an output, said desired value signal connected to the positive input of said first operational amplifier, said feedback signal connected to said positive input of said second operational amplifier, a capacitor connected between said negative inputs of said first and second operational amplifiers, a first variable feedback resistor connected between said output and said negative input of said first operational amplifier, a second variable feedback resistor connected between said output and said negative input of said second operational amplifier, said saturation override signal connected to said positive input of said instrumentation amplifier, a resistance connected between said output of said second operational amplifier and said positive input of said instrumentation amplifier, all adapted to supply from the output of said instrumentation amplifier a correction signal as a function of $G[F-DV]+C_1\times(R_1+R_2)\times d(F-DV)/dt]$.

60. The device defined in claim 59, wherein means to utilize said correction signal includes a corrective action circuit adapted to provide signals to a driving means to adjust a process device.

61. The device defined in claim 60, wherein said corrective action circuit is adapted to provide signals to a driving means to operate a stepping motor or a reversible device to adjust the process device and includes an absolute value circuit having an input adapted to receive said correction signal and having outputs consisting of a polarity signal and a signal equivalent to the absolute value of the correction signal, a deadband comparator having an input and an output with the input connected to the output of said absolute value circuit, means to supply deadband reference values to said deadband comparator, a summing amplifier having an input and an output, with the input connected to the output of said absolute value circuit, a voltage to frequency converter having an input and an output with the input connected to the output of said summing amplifier, an analog switch having an input, a control input and an output with the output in the form of a clock signal, with said input being connected to the output of said voltage to frequency converter and said control input being connected to the output of said deadband comparator, with said clock signal and said polarity signal supplied to said driving means thereby adjusting said process device.

62. The device defined in claim 61, wherein said driving means consists of a two directional switched driver.

63. The device defined in claim 60, wherein said corrective action circuit is adapted to provide signals to a driving means to operate an operator which is pneumatic in nature or requires a variable reference signal to adjust the process device and includes an absolute value circuit having an input adapted to receive said correction signal and an output, a scaling circuit having an input and an output, the input of said scaling circuit also connected to said correction signal, an analog switch having an input, a control input, and an output, the input thereof being connected to said scaling circuit, a deadband comparator having an input and an output, with the input thereof connected to the output of said absolute value circuit and the output thereof connected to said control input of said analog switch, a means to supply deadband reference values to said deadband comparator, an integrator having an input and an output with the input thereof being connected to the output of said analog switch, a buffer-scaler having an input and an output with the input thereof connected to the output of said integrator circuit, and the output thereof supplying a signal to said driving means thereby adjusting said process device.

64. The device defined in claim 63, wherein said absolute value circuit includes a first absolute value circuit operational amplifier having positive and negative inputs and an output, an analog common, a resistor having a value of ⅔ R connected between the positive input of said first absolute value circuit operational amplifier and analog common, a first summing junction, a connection between the negative input of said first absolute value circuit operational amplifier and said first summing junction, a resistor having a value of R adapted to receive said correction signal and connected to said first summing junction, a second summing junction, a resistor of value 2R interposed between said resistor of value R and said second summing junction, a junction point, a first resistor of value R interposed between said junction point and said first summing junction, a second resistor of value R interposed between said junction point and said second summing junction, a first steering diode having an anode and a cathode with said anode connected to said junction point and with said cathode connected to the ouput of said first absolute value circuit operational amplifier, a second steering diode having an anode and a cathode with its cathode connected to said first summing junction and its anode connected to the output of said first operational amplifier, a second absolute value circuit operational amplifier having positive and negative inputs and an output, with said negative input connected to said second summing junction, a resistor having a value of ⅔ R interposed between analog common and the positive input of said second absolute value operational amplifier, a resistor of value 2R interposed between said output of said second absolute value circuit operational amplifier and said second summing junction, a third absolute value circuit operational amplifier having positive and negative inputs and an output, the negative input of said third absolute value circuit operational amplifier being connected to the output of said first absolute value circuit operational amplifier, a resistor having a value of R/10 connected between the positive input of said third operational amplifier and analog common, and a resistor of value 10R interposed between the output of said third absolute value circuit operational amplifier and its positive input, all adapted to provide a polarity signal at the output of said third absolute value circuit operational amplifier and to provide a signal corresponding to the absolute value of said correction signal at the output of said second absolute value circuit operational amplifier.

65. The device defined in claim 64, wherein said summing amplifier includes an operational amplifier having a positive and negative input and an output, with said positive input connected to analog common through a resistor, a voltage follower circuit including the resistance Rf interposed between said output and said negative input of said operational amplifier, an adjustable resistance having the value Rb connected to the negative input of said operational amplifier and adapted to receive said correction signal, and a base speed reference device also being connected through a resistor Ra to said negative input of said operational amplifier, all adapted to produce an output from said operational amplifier according to the function $-Rf(Y+X)/Ra\,Rb$.

66. The device defined in claim 65, wherein said integrator includes an integrator operational amplifier having positive and negative inputs and an output with said positive input of said integrator operational amplifier being connected to analog common, a capacitance having a value of $C_I$ being connected from said negative input of said integrator operational amplifier to said output thereof, and a resistance having a value of $R_I$ being connected to said negative input of said operational amplifier.

67. The device defined in claim 66, wherein said buffer scaler includes an NPN transistor, a PNP transistor, the output signal from the integrator or summing integrator supplied to the base of both transistors, the collector of said NPN transistor connected to the positive power supply voltage, the collector of said PNP transistor connected to negative power supply voltage, and the emitters of both transistors connected to a scaling resistance Rs which provides an output signal to said driving means.

* * * * *